(12) United States Patent
Scardera et al.

(10) Patent No.: US 9,246,029 B2
(45) Date of Patent: *Jan. 26, 2016

(54) METHOD FOR MANUFACTURING AN INTERDIGITATED BACK CONTACT SOLAR CELL

(71) Applicant: E I DU PONT DE NEMOURS AND COMPANY, Wilmington, DE (US)

(72) Inventors: Giuseppe Scardera, Sunnyvale, CA (US); Dmitry Poplavskyy, San Jose, CA (US); Daniel Aneurin Inns, Palo Alto, CA (US); Karim Lotfi Bendimerad, San Francisco, CA (US); Shannon Dugan, Sunnyvale, CA (US)

(73) Assignee: E I DU PONT DE NEMOURS AND COMPANY, Wilmington, DE (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/627,350

(22) Filed: Feb. 20, 2015

(65) Prior Publication Data

US 2015/0187968 A1 Jul. 2, 2015

Related U.S. Application Data

(62) Division of application No. 14/084,982, filed on Nov. 20, 2013, now Pat. No. 9,048,374.

(51) Int. Cl.
*H01L 21/00* (2006.01)
*H01L 31/0224* (2006.01)
(Continued)

(52) U.S. Cl.
CPC .... *H01L 31/022441* (2013.01); *H01L 31/0201* (2013.01); *H01L 31/022433* (2013.01); *H01L 31/0682* (2013.01); *H01L 31/1804* (2013.01); *Y02P 70/521* (2015.11)

(58) Field of Classification Search
USPC ........ 438/98, 57, 83, 233, 232, 399, 523, 533
See application file for complete search history.

(56) References Cited

U.S. PATENT DOCUMENTS 9,048,374 B1 * 6/2015 Scardera ............. H01L 31/0201
2008/0210298 A1 9/2008 Kuebelbeck
(Continued)

FOREIGN PATENT DOCUMENTS

JP 2011-124603 A 11/2011

OTHER PUBLICATIONS

International Search Report and Written Opinion (PCT/US2014/066598) Dated Feb. 18, 2015.
(Continued)

*Primary Examiner* — Timor Karimy

(57) ABSTRACT

A method for manufacturing an interdigitated back contact solar cell, comprising steps of: (a) providing a doped silicon substrate; (b) doping the rear surface of the substrate homogeneously with boron in a blanket pattern, thereby forming a p+ region on the rear surface of the silicon substrate; (c) forming a silicon dioxide layer on the front and rear surface; (d) depositing a phosphorus-containing doping paste on the rear surface in a second pattern; (e) heating the silicon substrate to locally diffuse phosphorus into the rear surface of the silicon substrate, thereby forming an n+ region on the rear surface of the silicon substrate through the second pattern, wherein the p+ region and the n+ region on the rear surface collectively form an interdigitated pattern; and (f) removing the second silicon dioxide layer from the silicon substrate.

11 Claims, 28 Drawing Sheets

(51) Int. Cl.
*H01L 31/18* (2006.01)
*H01L 31/068* (2012.01)
*H01L 31/02* (2006.01)

(56) References Cited

U.S. PATENT DOCUMENTS

| | | | |
|---|---|---|---|
| 2010/0081264 | A1 | 4/2010 | Leung et al. |
| 2011/0003424 | A1 | 1/2011 | De Ceuster et al. |
| 2012/0145967 | A1 | 6/2012 | Rogojina et al. |
| 2012/0280183 | A1 | 11/2012 | Kelman et al. |

OTHER PUBLICATIONS

Woehl, R. et al., "19.7% Efficient All-Screen-Printed Back-Contact Back-Junction Silicon Solar Cell With Aluminum-Alloyed Emitter", IEEE Electron Device Letters, IEEE Service Center, New York, NY, US, vol. 32, No. 3, Mar. 1, 2011, pp. 345-347, XP011348583, ISSN: 0741-3106, DOI: 10.1109/LED.2010.2097238, p. 345, right-hand column, paragraph 3, p. 346, right-hand column, paragraph 1; figure 2.

U.S. Appl. No. 13/602,919, filed Sep. 4, 2012, Scardera et al.

Verlinden, P.J., Swanson, R.M., Crane, R. A., 7000 High-efficiency Cells for a Dream, Progress in Photovoltaics: Research and Applications, vol. 2, pp. 143-152 (1994).

Granek, Filip, High-Efficiency Back-Contact Back-Junction Silicon Solar Cells, Dissertation, Fraunhofer Institut fur Solare Energiesysteme (ISE) Freiburg im Breisgau, 2009.

Neuhaus, Dirk-Holger and Munzer, Adolf, Industrial Silicon Wafer Solar Cells, Hindawi Publishing Corporation, Advances in OptoElectronics, vol. 2007, Article ID 24521, 15 Pgs.

Binns, M.J., Kommu, S., Seacrist, M.R., Standley, R.W., Wise, R., Myers, D.J., Tisserand, D. and Doyle, D., The Control of Boron Autodoping During Device Processing for P/P+ EPI Wafers with No Back-Surface Oxide Seal, MEMC Electronic Materials, Inc., 9th Int. Symp. Silicon Materials Science & Technology, Philadelphia, May 12-17, 2002.

Lammert, Michael D. and Schwartz, Richard J., The Interdigitated Back Contact Solar Cell: A Silicon Solar Cell for Use in Concentrated Sunlight, IEEE Transactions on Electron Devices, Ed-24, No. 4, Apr. 1977, pp. 337-342.

Mouhoub, A., Benyahia, B., Mahmoudi, and Mougas, A., Selective Emitters for Screen Printed Multicrystalline Silicon Solar Cells, Rev. Energ. Ren.: ICPWE (2003), pp. 83-86.

Debarge, L., Schott, M., Muller, J.C., Monna, R., Selective emitter formation with a single screen-printed p-doped paste deposition using out-diffusion in an RTP-step, Solar Energy Materials & Solar Cells 74 (2002), pp. 71-75.

Edwards, Matthew, Bocking, Jonathan, Cotter, Jeffrey E., and Bennett, Neil, Screen-Print Selective Diffusions for High-Efficiency Industrial Silicon Solar Cells, Progress in Photovoltaics: Research and Applications, 2008, vol. 16, pp. 31-45.

Hubbard, K.J. and Schlom, D. G., Thermodynamic stability of binary oxides in contact with silicon, Journal of Matierials Research, vol. 11, Issue 11, 1996, pp. 2757-2776.

\* cited by examiner

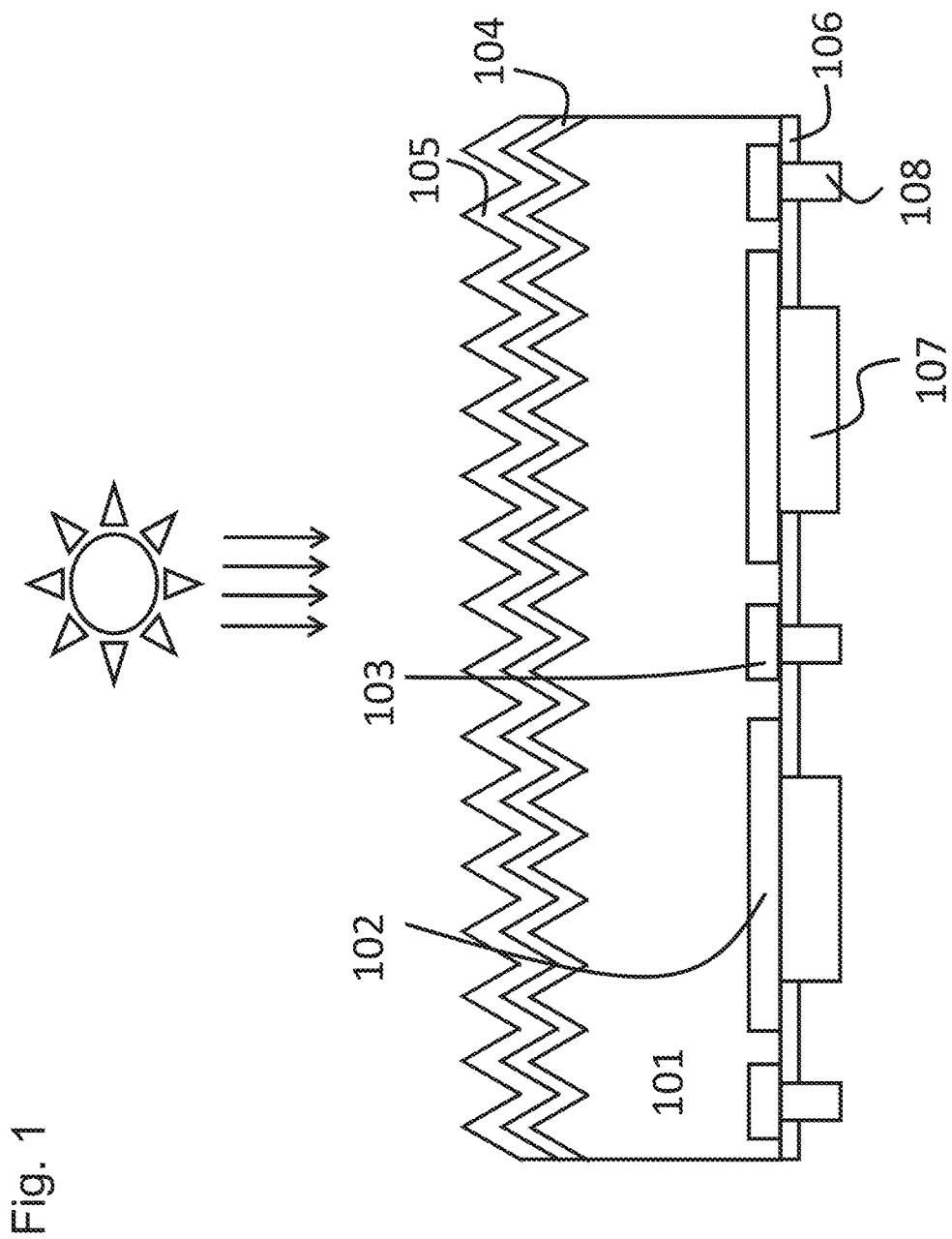

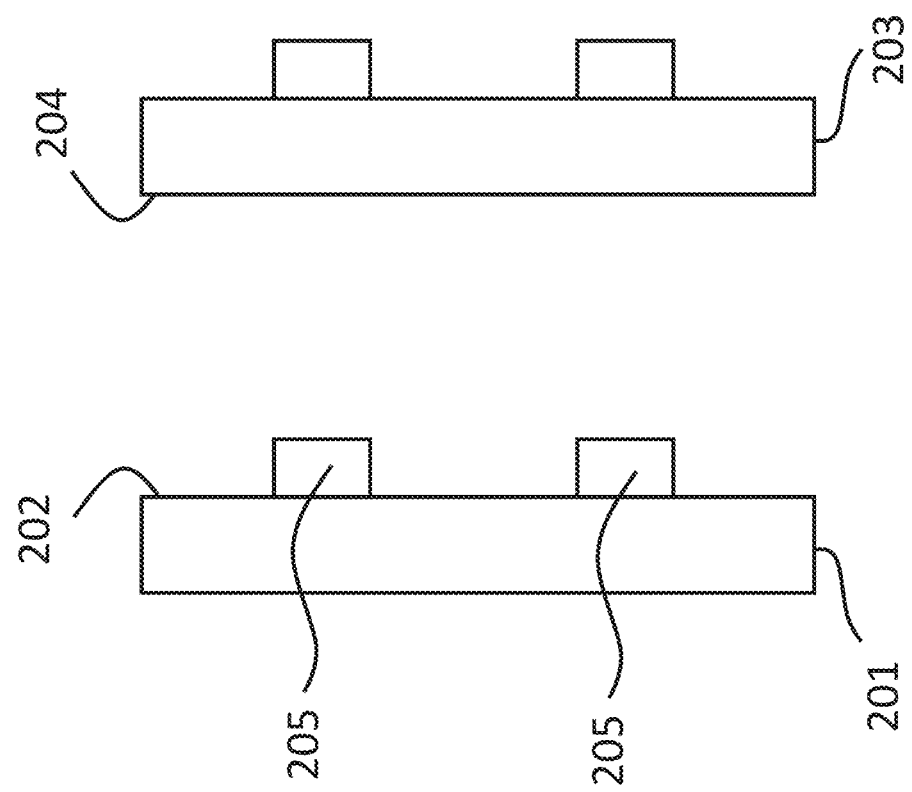

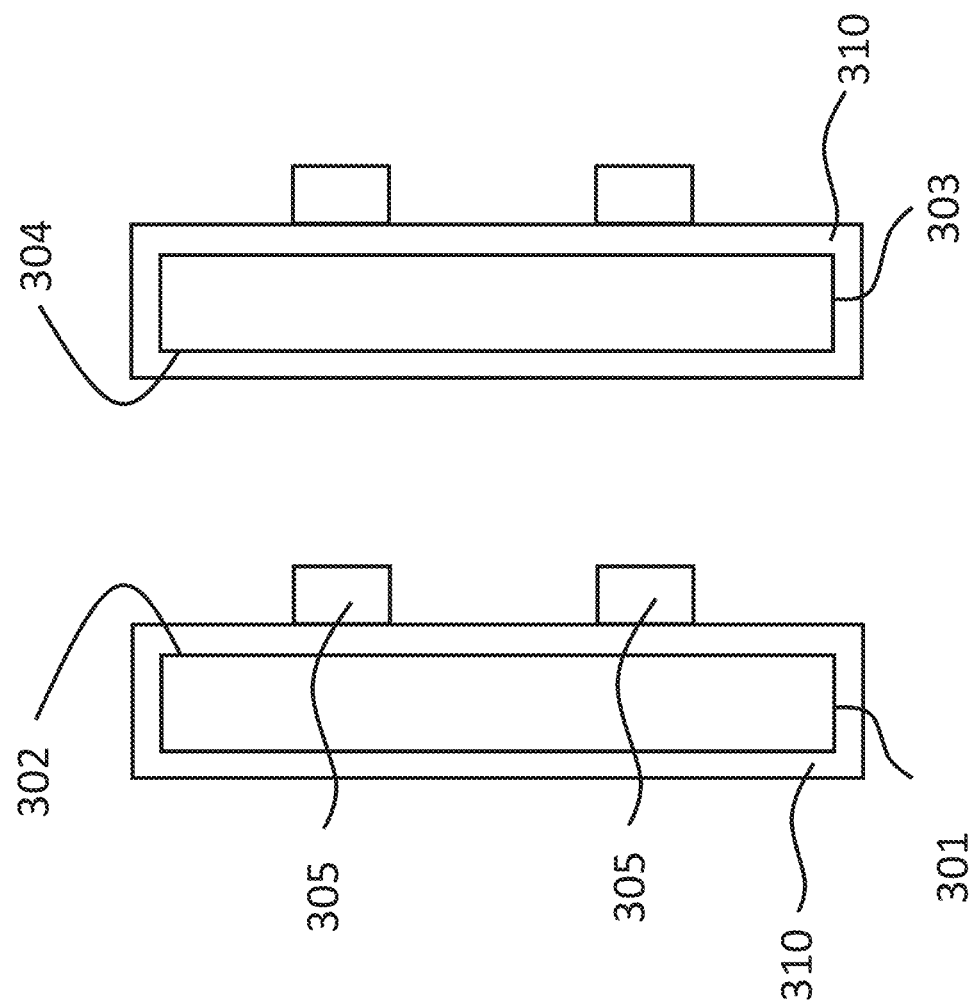

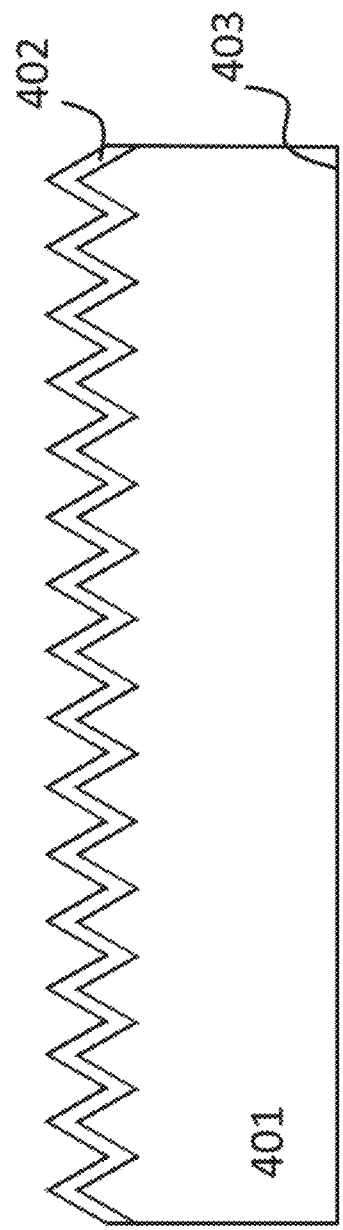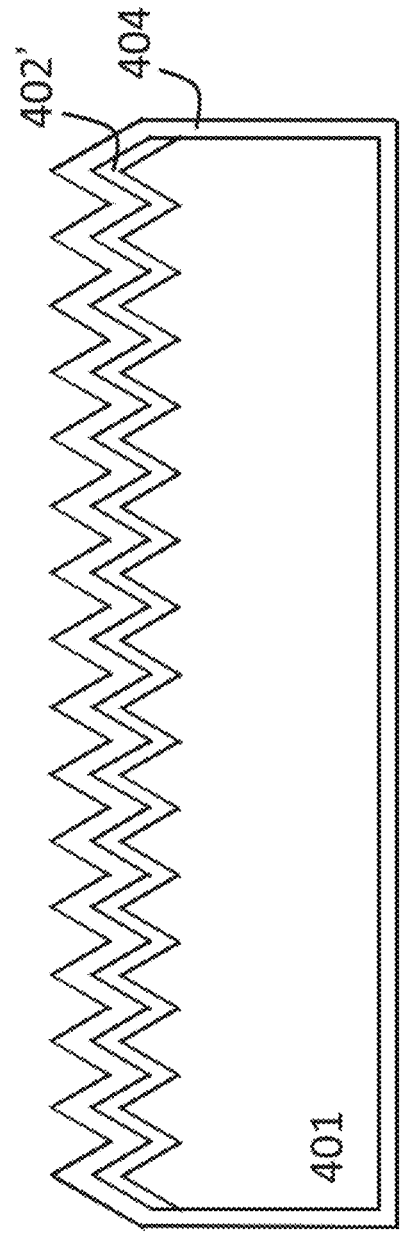

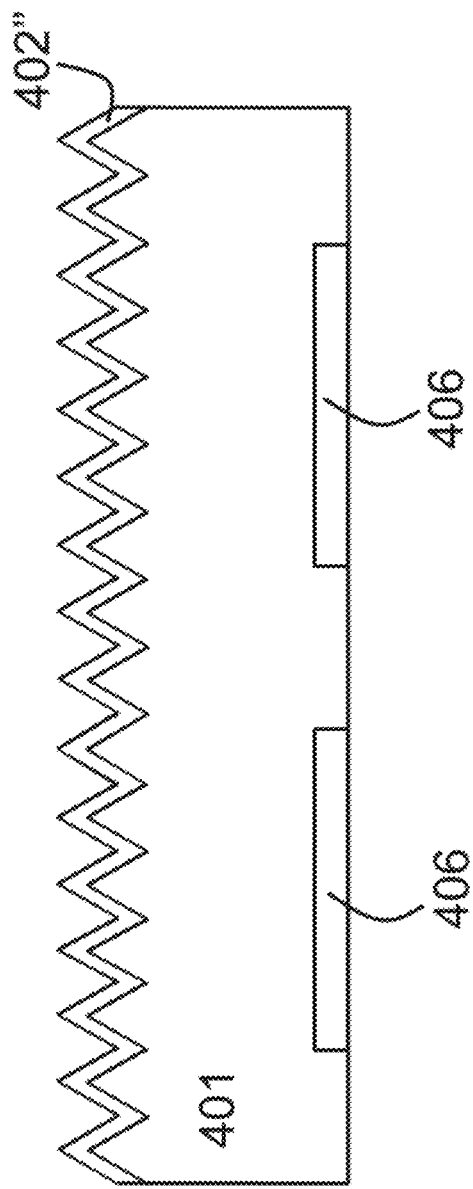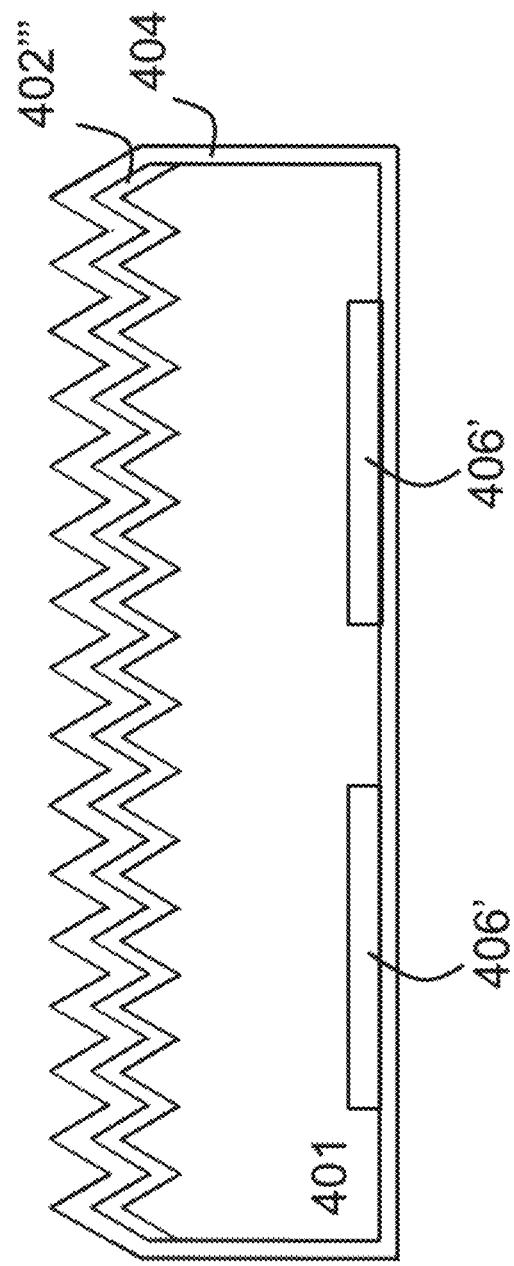

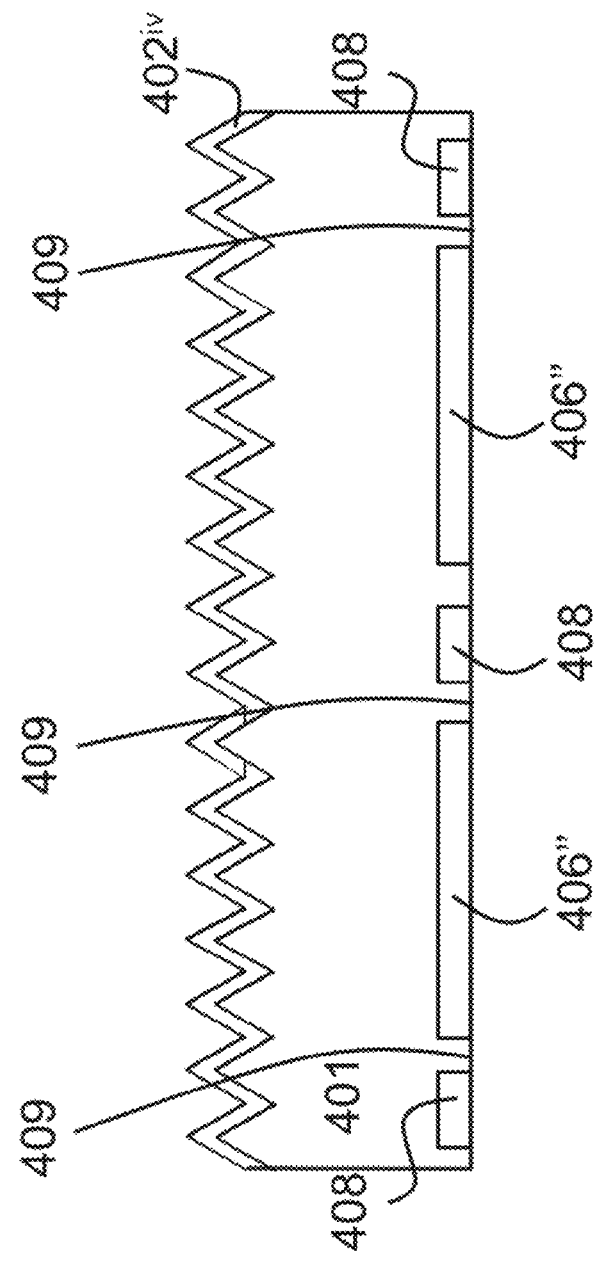
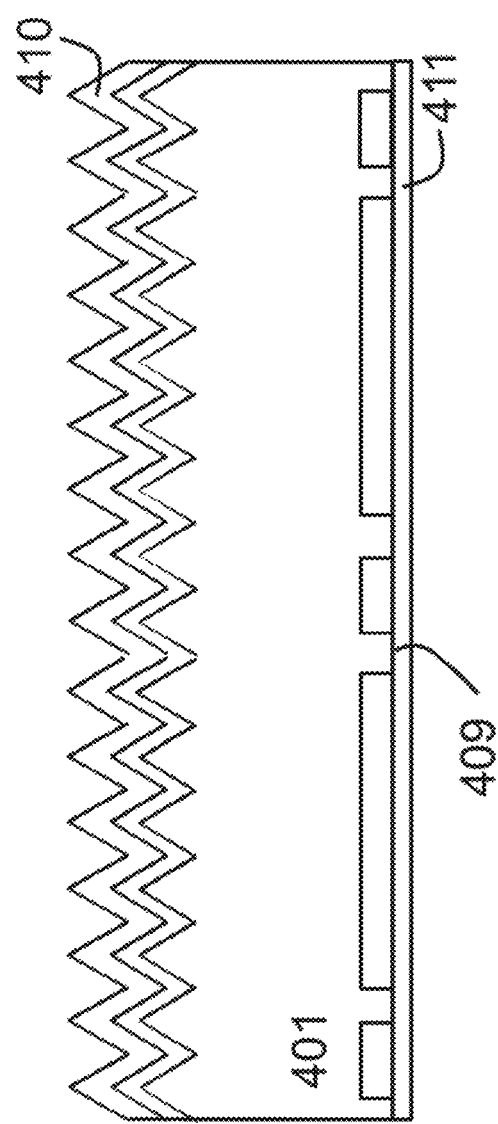
Fig. 4K
Fig. 4L

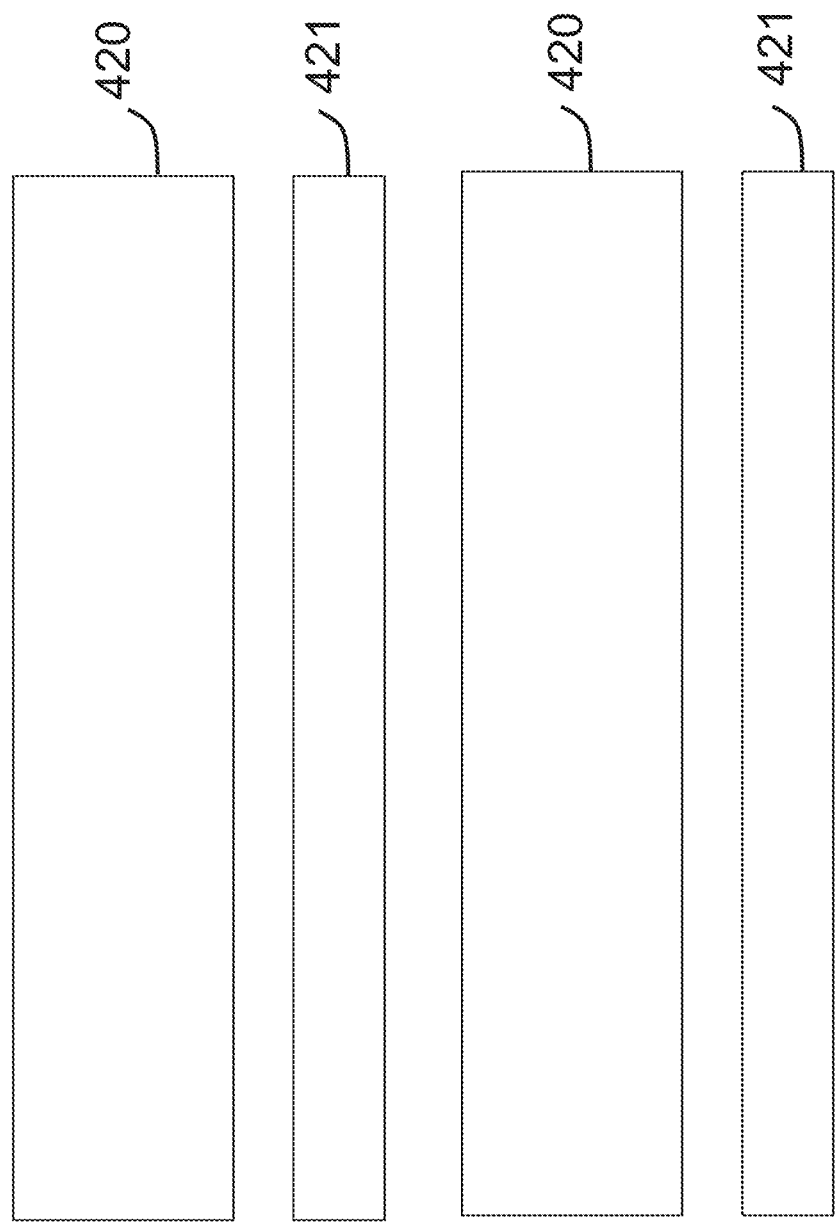

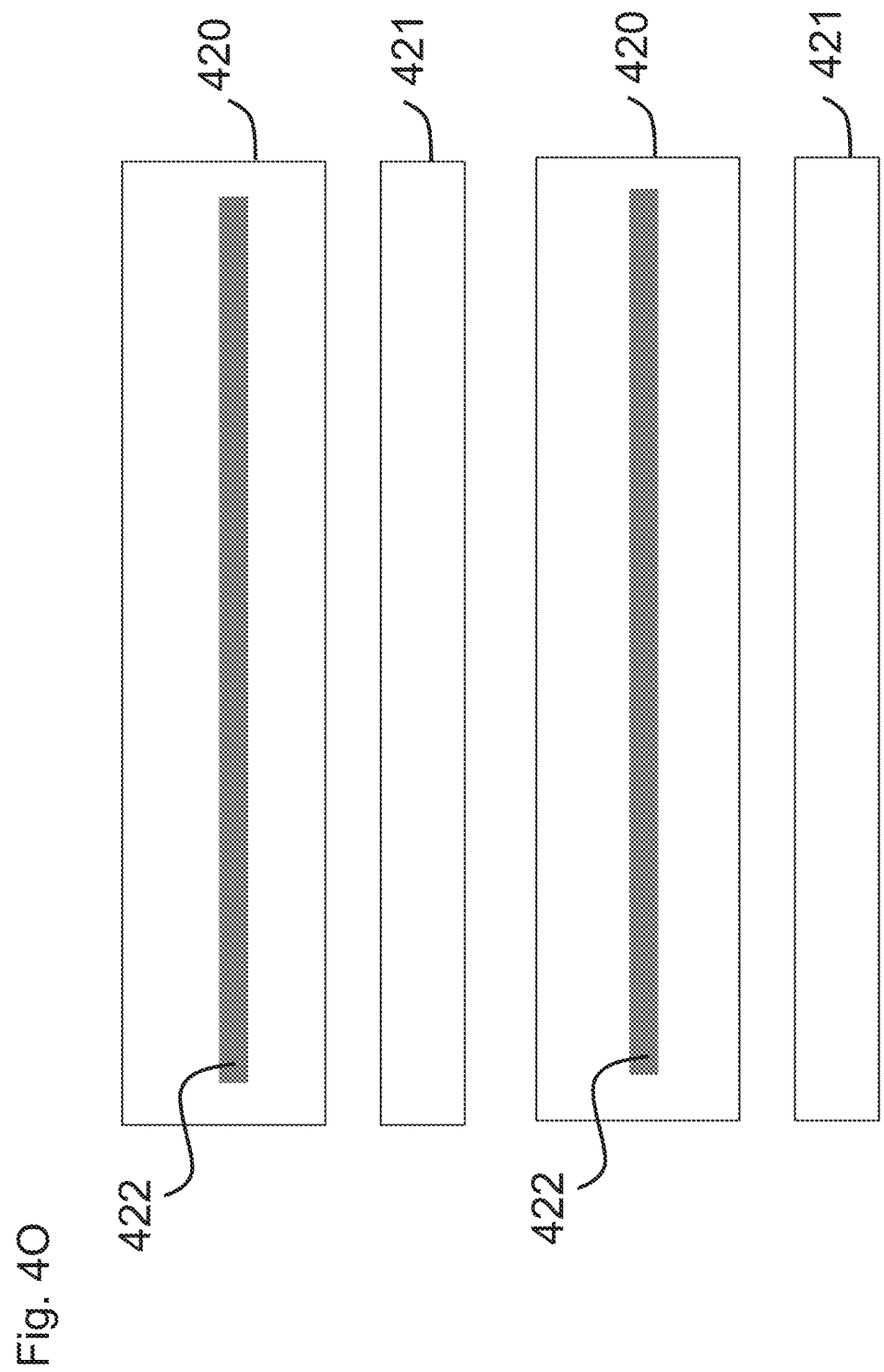

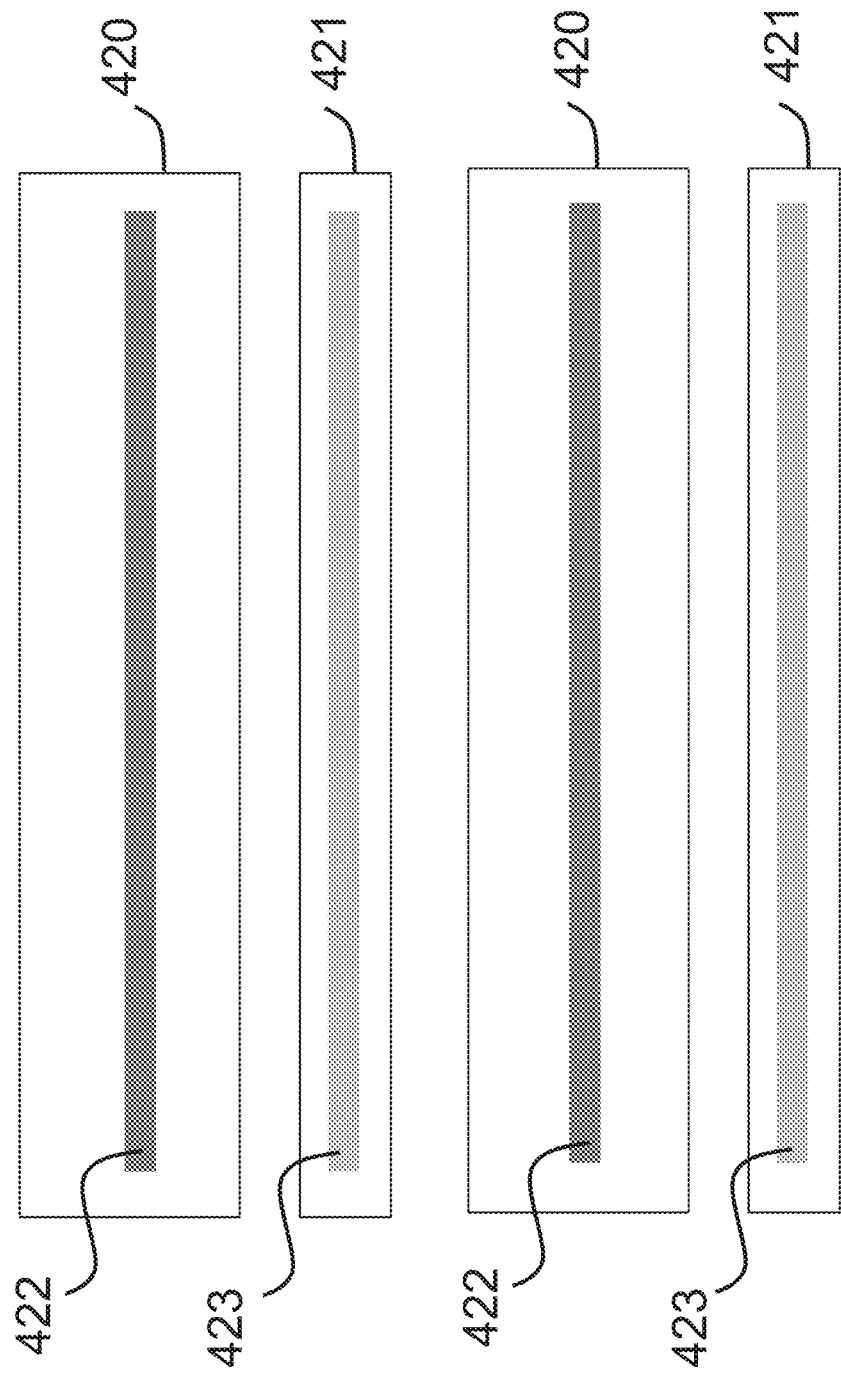

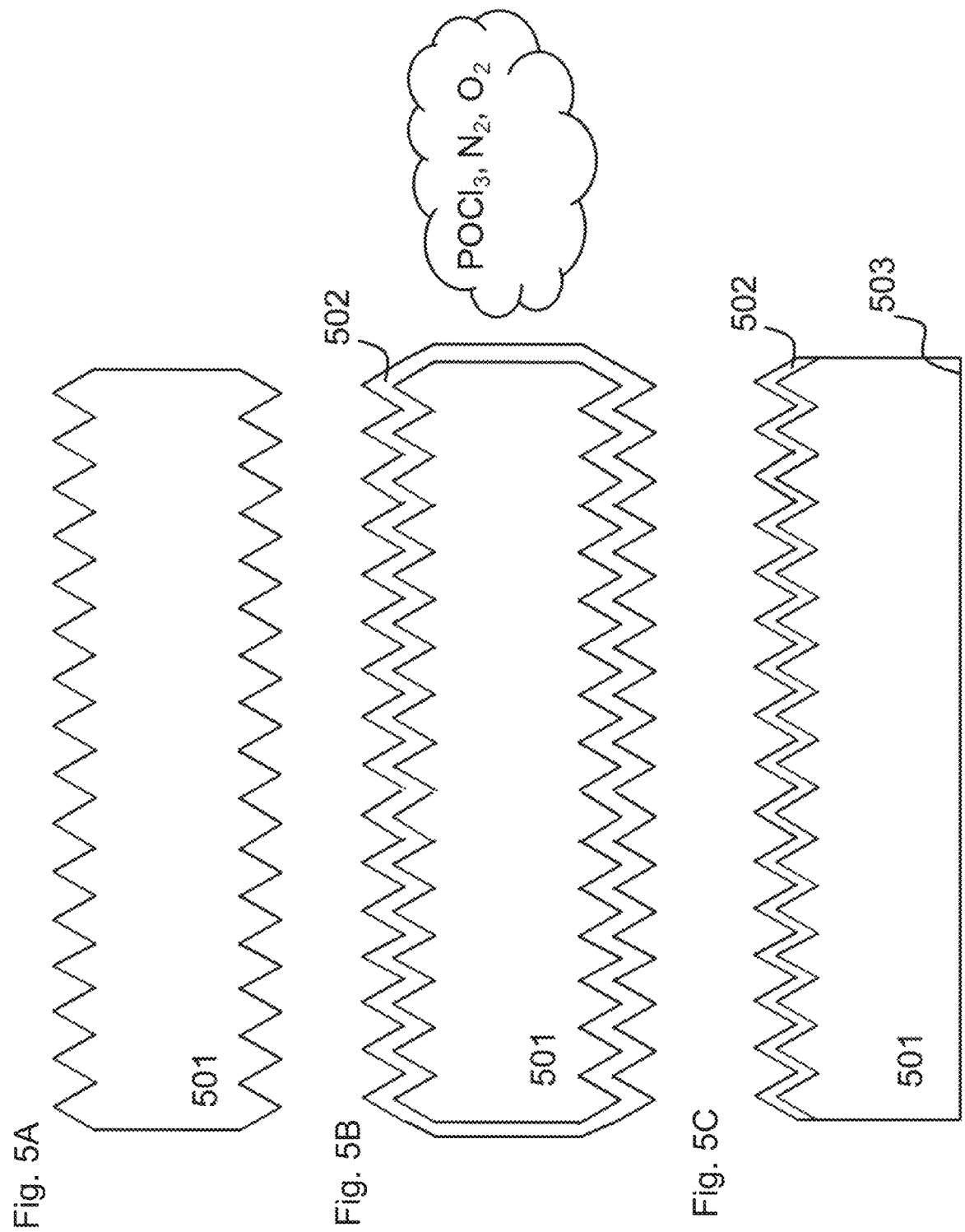

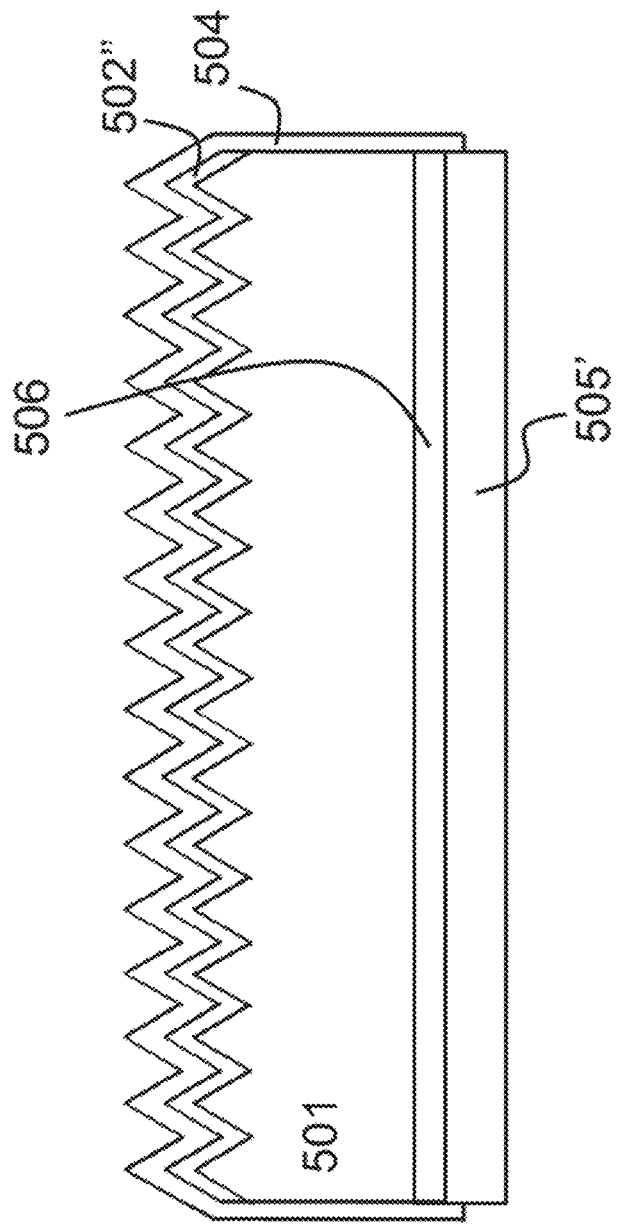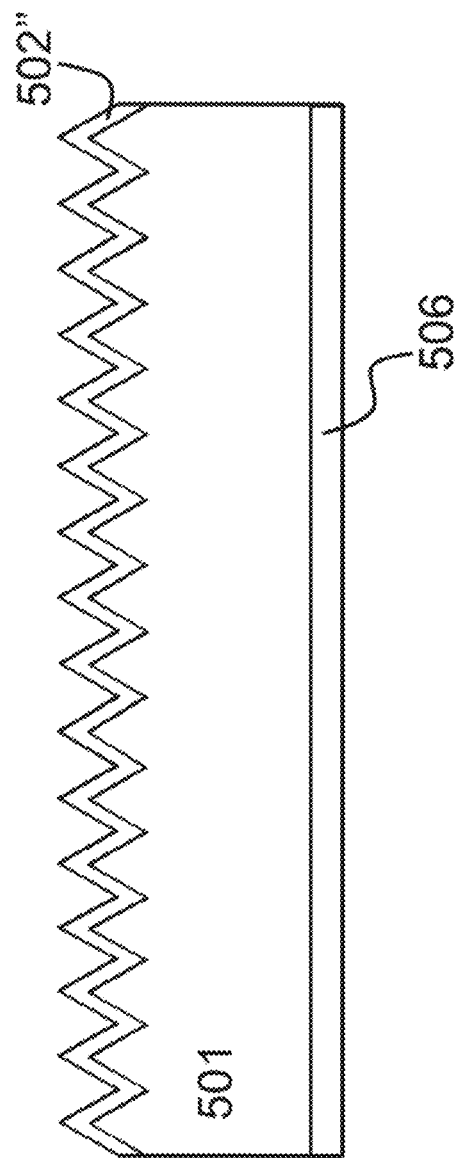

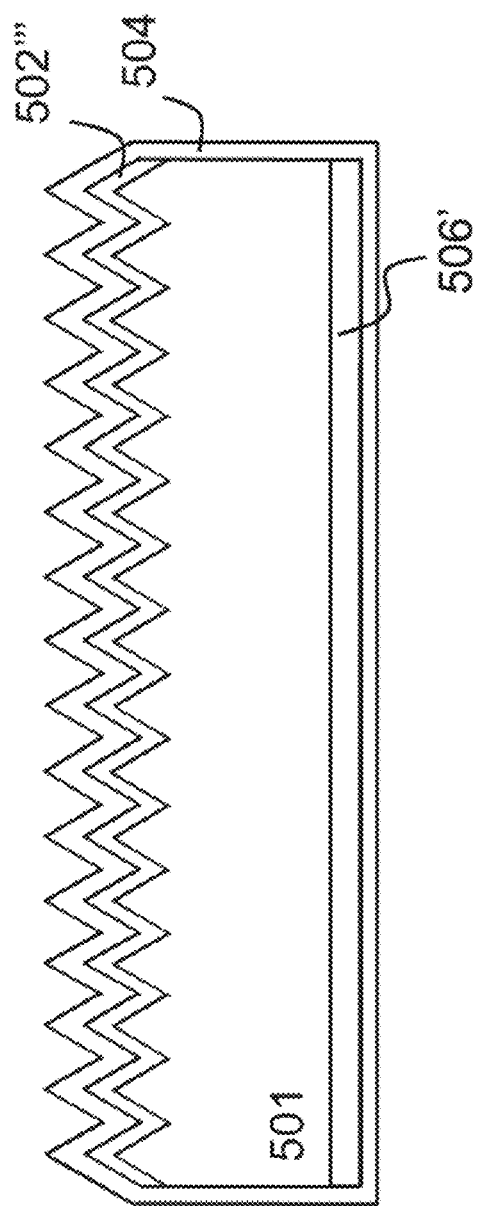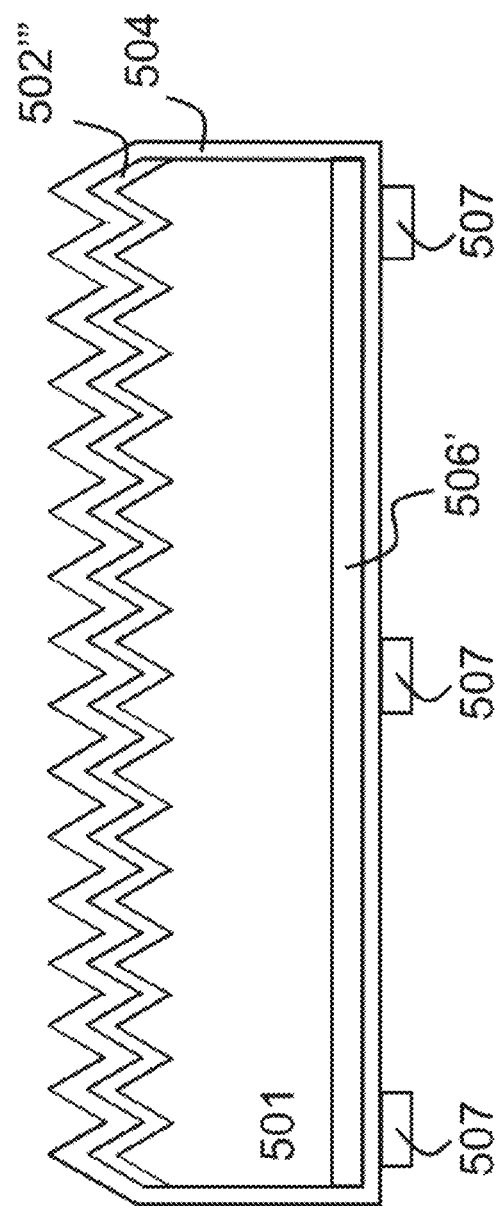

US 9,246,029 B2

METHOD FOR MANUFACTURING AN INTERDIGITATED BACK CONTACT SOLAR CELL

CROSS-REFERENCE TO RELATED APPLICATION

This application is a divisional application of Ser. No. 14/084,982 filed on Nov. 20, 2013.

FIELD OF THE INVENTION

This disclosure relates to an interdigitated back contact solar cell where localized boron diffused areas and phosphorus diffused areas are formed on the rear side.

TECHNICAL BACKGROUND OF THE INVENTION

One approach to overcome the limitations of a conventional front-contacted solar cell is to move both the p-n junction and the back surface field (BSF) to the rear side of the solar cell. This architecture is referred to as the interdigitated back contact (IBC) solar cell. The concept of the IBC solar cell was first proposed by Lammert and Schwartz [M. D. Lammert and R. J. Schwartz, "The interdigitated back contact solar cell: a silicon solar cell for use in concentration," IEEE Translations on Electron Devices, vol. 24, no. 4, pp. 337-342, 1977].

By moving both the p-n junction and BSF to the rear, all metallization required to extract generated carriers is also moved to the rear side. The front, sunward side is therefore free from shading losses, enabling higher short circuit current and thus efficiency. The front surface no longer needs a heavily diffused layer optimized for metal contact, but instead can be optimized to create a front surface field (FSF) which minimizes recombination losses at the front surface thereby increasing the open circuit voltage and thus efficiency. Another advantage of having metal contacts on the rear side is that the metal geometry is no longer constrained to minimize shading losses, allowing for wider metal which reduces resistive losses. Having all metal contacts on the back side also has the added benefit of simplifying integration of solar cells into a module.

Various methods have been suggested with regard to the manufacturing process of the IBC cell. Such methods are described in P. J. Verlinden, R. M. Swanson and R. A. Crane, Prog. Photovolt: Res. Appl. 2, 143-152 (1994); F. Granek, "High-Efficiency Back-Contact Back-Junction Silicon Solar Cells," PhD Thesis, Fraunhofer Institute (ISE), Freiburg, Germany (2009); D-H. Neuhaus and A. Munzer, "Review Article: Industrial Silicon Wafer Solar Cells," Advances in OptoElectronics, Volume 2007, Article ID 24521, doi: 10.1155/2007/2451; US 2011/0003424; and US2010/0081264.

SUMMARY OF THE INVENTION

This invention describes a method of forming a high efficiency interdigitated back contact (IBC) solar cell employing localized boron and phosphorus diffused areas on the rear side achieved using a doping paste(s) and an oxide barrier layer. Introducing an oxide layer prior to printing patterned doping pastes allows for boron and phosphorus diffusion into the underlying wafer and at the same time eliminates unintended doping, referred to as autodoping, onto neighboring silicon surfaces.

An aspect of the invention is a method for manufacturing an interdigitated back contact solar cell, comprising steps of: (a) providing a doped silicon substrate, the substrate comprising a front, sunward facing, surface and a rear surface; (b) forming a first silicon dioxide layer on the front surface and the rear surface; (c) depositing a boron-containing doping paste on the first silicon dioxide layer of the rear surface in a first pattern, wherein the boron-containing paste comprises a boron compound and a solvent; (d) heating the silicon substrate in a first ambient to a first temperature and for a first time period in order to locally diffuse boron into the rear surface of the silicon substrate, thereby forming a p+ region on the rear surface of the silicon substrate; (e) removing the first silicon dioxide layer from the silicon substrate; (f) forming a second silicon dioxide layer on the front surface and the rear surface; (g) depositing a phosphorus-containing doping paste on the second dioxide layer of the rear surface in a second pattern, wherein the phosphorus-containing doping paste comprising a phosphorus compound and a solvent; (h) heating the silicon substrate in a second ambient to a second temperature and for a second time period in order to locally diffuse phosphorus into the rear surface of the silicon substrate, thereby forming an n+ region on the rear surface of the silicon substrate; and (i) removing the second silicon dioxide layer from the silicon substrate, wherein the first pattern and the second pattern collectively form an interdigitated pattern.

Another aspect of the invention is a method for manufacturing an interdigitated back contact solar cell, comprising steps of: (a) providing a doped silicon substrate, the substrate comprising a front, sunward facing, surface and a rear surface; (b) doping the rear surface of the substrate homogeneously with boron in a first pattern, thereby forming a p+ region on the rear surface of the silicon substrate, wherein the first pattern is a blanket pattern; (c) forming a silicon dioxide layer on the front surface and the rear surface; (d) depositing a phosphorus-containing doping paste on the rear surface in a second pattern, wherein the phosphorus-containing doping paste comprising a phosphorus compound and a solvent; (e) heating the silicon substrate in an ambient to a temperature and for a time period in order to locally diffuse phosphorus into the rear surface of the silicon substrate, thereby forming an n+ region on the rear surface of the silicon substrate through the second pattern, wherein the p+ region and the n+ region on the rear surface collectively form an interdigitated pattern; and (f) removing the second silicon dioxide layer from the silicon substrate.

BRIEF DESCRIPTION OF THE DRAWINGS

FIG. 1 shows a schematic view of an interdigitated back-contact (IBC) solar cell.

FIG. 2A shows a configuration where two silicon wafers are vertically parallel to each other.

FIG. 3A shows two silicon wafers (301) and (303) with $SiO_2$ layer (310) in the same configuration as the wafers in FIG. 2A.

FIG. 4C shows the removal step of the rear side phosphorus diffused layer. FIG. 4D shows the oxidation step. FIG. 4G shows the oxide layer stripping step. FIG. 4H shows the oxidation step. FIG. 4K shows the oxide layer stripping step. FIG. 4L shows the passivation step. FIG. 4N shows a planview of two boron emitters and two phosphorus BSF regions. FIG. 4O shows a pattern of the boron emitter metal contact. FIG. 4P shows a pattern of the BSF metal contact.

FIG. 5A shows the texturizing step. FIG. 5B shows the phosphorus diffusion step. FIG. 5C shows the removal step of the rear side phosphorus diffused layer. FIG. 5F shows the boron drive-in step. FIG. 5G shows the oxide layer stripping step. FIG. 5H shows the oxidation step. FIG. 5I shows the printing step of the phosphorus paste.

DETAILED DESCRIPTION OF THE INVENTION

Figure 2B:
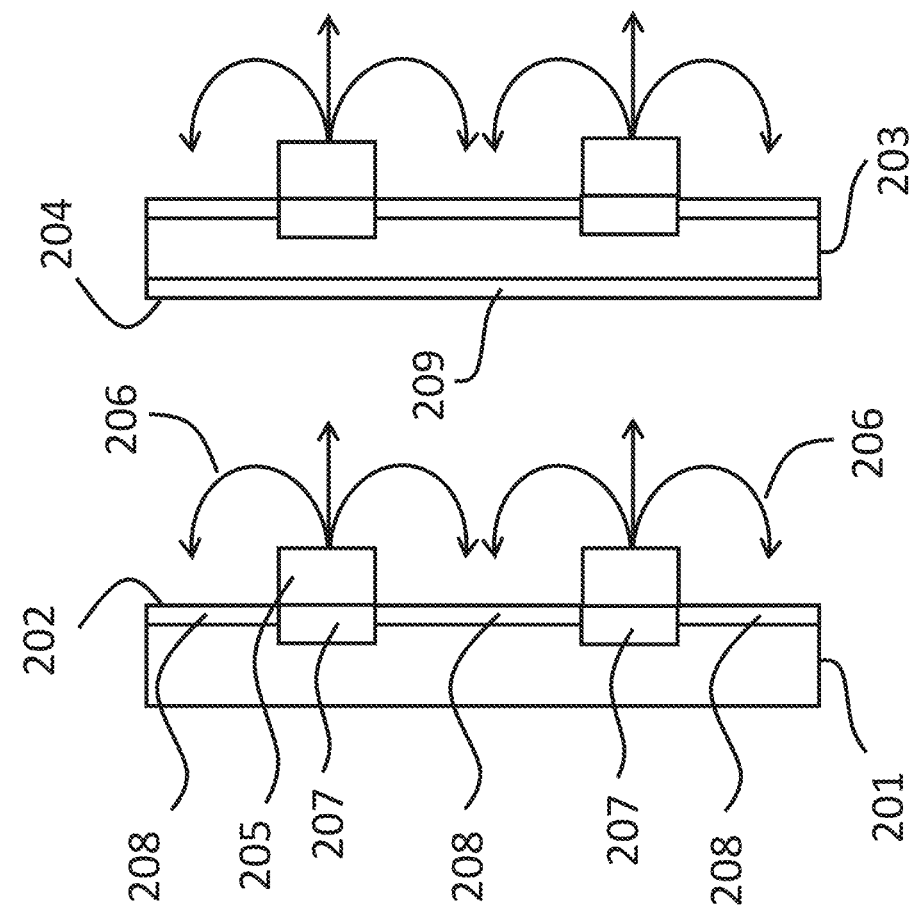
FIG. 2B shows the effects of a high temperature treatment on the wafers shown in FIG. 2A.

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

A schematic view of an interdigitated back-contact (IBC) solar cell is shown in FIG. 1. The IBC solar cell of FIG. 1 is an embodiment and the scope of the present invention is not limited to the specific type of the IBC solar cell. For example, a boron doped silicon substrate can be used instead of a phosphorus doped silicon substrate. In the embodiment of FIG. 1, a phosphorus doped silicon substrate (101) is used as the absorber. A boron emitter (102) is formed on the rear side of the cell to create the p-n junction required to separate carriers. A phosphorus BSF (103) is also formed on the rear side of the solar cell. The boron and phosphorus doped regions are formed in interdigitated patterns. A FSF (104) is formed on the front, sunward side of the solar cell, typically employing a phosphorus diffusion. The FSF repels minority carriers from the front surface thus minimizing recombination losses. The FSF also forms a current path for majority carriers to reach the BSF region and BSF contact.

The front and rear surfaces are coated with a passivation film, shown as (105) and (106), respectively. Such passivation film may comprise at least one of silicon nitride, aluminum oxide and silicon oxide. In some embodiments, the passivation film may be a stack structure comprising multiple, i.e. two or more layers. Such stack structure may include at least one layer comprising silicon nitride and at least one layer comprising one of silicon oxide and aluminum oxide. Boron emitter metal contacts (107) and BSF metal contacts (108) are formed on the rear side in order to extract generated carriers.

One approach that reduces the number of thermal steps is to screen print boron and/or phosphorus doping pastes in the required interdigitated pattern followed by a thermal drive-in process to transfer dopant atoms from the pastes into the underlying silicon substrate.

Achieving patterned and localized boron and phosphorus doping on a silicon wafer using boron-containing and phosphorus-containing doping pastes is made difficult by the tendency of these pastes to outgas during the thermal treatment required to diffuse dopants into the wafer. In order to diffuse boron or phosphorus from the doping pastes into the underlying silicon substrate, a thermal treatment at temperatures above 800° C. is typically used. At these elevated temperatures gaseous boron-containing and phosphorus-containing species are created from boron-containing and phosphorus-containing pastes, respectively. These gaseous species transfer onto nearby silicon surfaces, causing a spreading of dopant outside of the intended printed areas.

Gas-phase distribution of an initially patterned dopant region is called autodoping and degrades the pattern of the doped regions. Gas phase distribution and autodoping from phosphorus-containing doping pastes has been documented, for example, in [A. Mouhoub, B. Benyahia, B. Mahmoudi, and A. Mougas, "Selective Emitters for Screen Printed Multicrystalline Silicon Solar Cells," Rev. Energ. Ren.: ICPWE (2003) 83-86.; L. Debarge, M. Schott, J. C. Muller, and R. Monna, "Selective emitter formation with a single screen-printed p-doped paste deposition using out-diffusion in an RTP-step," Sol. Mat. Sol. Cells 74 (2002) 71-75; and M. Edwards, J. Bocking, J. E. Cotter, and N. Bennet, "Screen-Print Selective Diffusions for High Efficiency Industrial Silicon Solar Cells," Prog. Photovolt: Res. Appl. 16: 31-45 (2008)]. Boron autodoping has been observed from heavily doped epitaxial silicon layers which act as doping source regions for neighboring silicon wafers [M. J. Binns, S. Kommu, M. R. Seacrist, R. W. Standley, R. Wise, D. J. Myers, D. Tisserand, and D. Doyle, "The Control of Boron Autodoping during Device Processing for p/p+Epi Wafers with no Back-Surface Oxide Seal," Proceedings from $9^{th}$ Int. Symp. Silicon Materials Science & Technology (2002)].

Figure 3B:
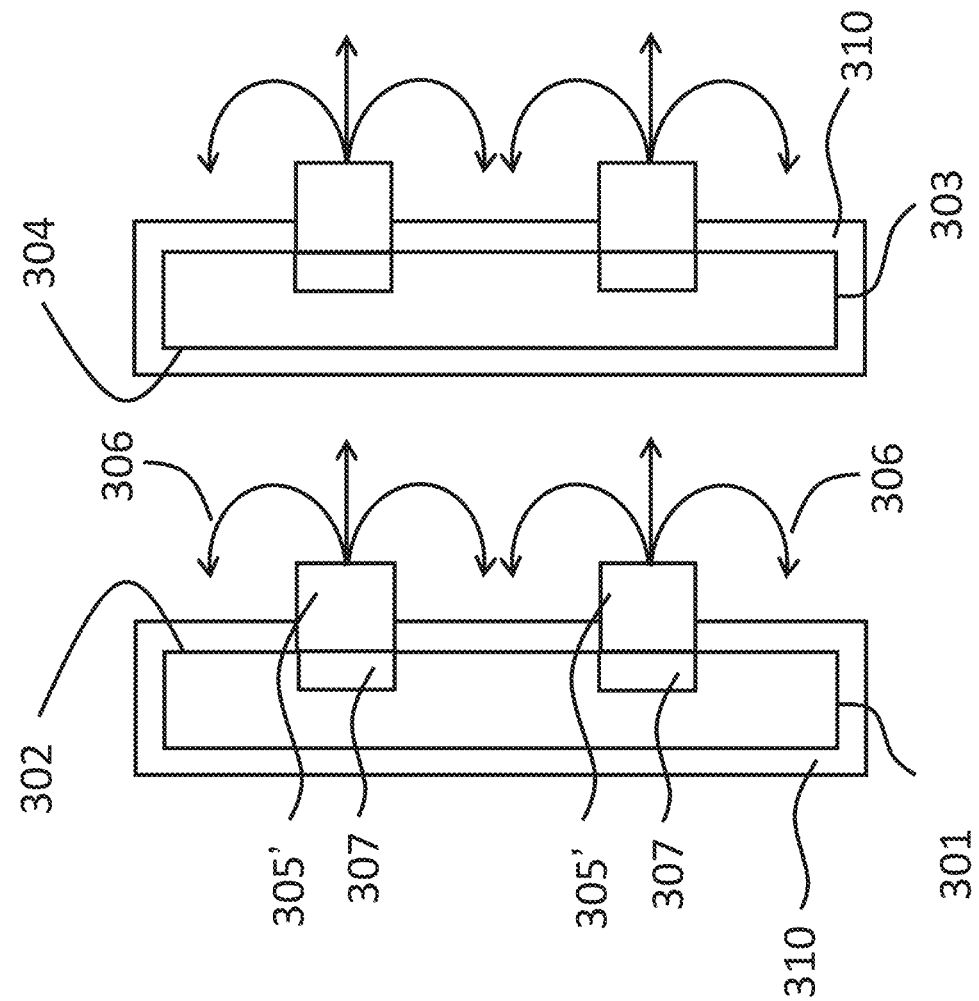
FIG. 3B shows the effects of a high temperature treatment on the wafers shown in FIG. 3A.

FIG. 2A and FIG. 2B schematically show the autodoping associated with a patterned doping source subjected to a thermal drive-in process. FIG. 3A and FIG. 3B schematically show a method for achieving localized doping free from autodoping using a patterned doping source and a barrier $SiO_2$ layer. FIG. 2A shows two silicon wafers (201) and (203) vertically parallel to each other, representing the typical orientation used when processing wafers inside of a quartz tube furnace. The rear surface (202) of wafer (201) is adjacent to the front side (204) of wafer (203). Also shown in FIG. 2A are patterned doping source regions (205) which can be either boron or phosphorus paste. When subjected to high temperature treatment, the doping source regions are intended to create localized doping of the underlying silicon substrate, i.e. dopant atoms are to be introduced into the substrate only in areas directly underneath the doping source.

FIG. 2B shows the effects of a high temperature treatment on the wafers shown in FIG. 2A. Wafers (201) and (203) are subjected to a high temperature drive-in step, typically 800° C. or higher, in order to drive dopant atoms from the doping pastes into the underlying silicon substrate forming doped areas (207) directly beneath the doping sources. At these elevated temperatures, dopant species (206) transfer from the doping source regions (205) onto the rear surface (202) of the underlying wafer (201) as well as onto the front side (204) of the neighboring wafer (203). The transfer of dopant species (206) results in unintended doping, referred to as autodoping, creating a doped layer (208) on the rear side (202) of the underlying wafer (201) as well as creating a doped layer (209) on the front side of the neighboring wafer (203). Autodoping results in the loss of the localized doping.

Maintaining localized doping and eliminating autodoping can be achieved by introducing a protective $SiO_2$ layer on the silicon wafer surface prior to applying a patterned doping source layer.

FIGS. 3A and 3B show two silicon wafers (301) and (303) in the same configuration as the wafers in FIG. 2A, but with each wafer having all surfaces covered with a $SiO_2$ layer (310). The rear surface (302) of wafer (301) is adjacent to the front side (304) of wafer (303). Also shown in FIG. 3A are patterned doping source regions (305) which are separated from the rear surface (302) by the $SiO_2$ layer (310). The doping sources (305) can be either boron or phosphorus pastes.

FIG. 3B shows the effects of a high temperature treatment on the wafers shown in FIG. 3A. Wafers (301) and (303) are subjected to a high temperature drive-in step, typically 800° C. or higher. The doping source regions (labeled as (305) in FIG. 3A) locally react with the underlying $SiO_2$ creating new doping source layers (305'). The doping source layers (305') make contact with the underlying silicon wafer surface. Dopant atoms are driven from the doping source layers (305') into the underlying wafer, creating localized doped areas (307).

At these elevated temperatures dopant species (306) transfer from the doping source regions (305') onto the $SiO_2$ layer (310) covering the rear surface (302) of the underlying wafer (301) as well as onto the $SiO_2$ layer (310) covering the front side (304) of the neighboring wafer (303). The $SiO_2$ layer (310) acts as a barrier for areas not covered with the dopant source layer (305'), preventing dopant species (306) from reaching the rear surface (302) of the underlying wafer (301) as well as onto the front side (304) of the neighboring wafer (303). The $SiO_2$ layer (310) enables localized doping and eliminates autodoping.

Figure 4A:
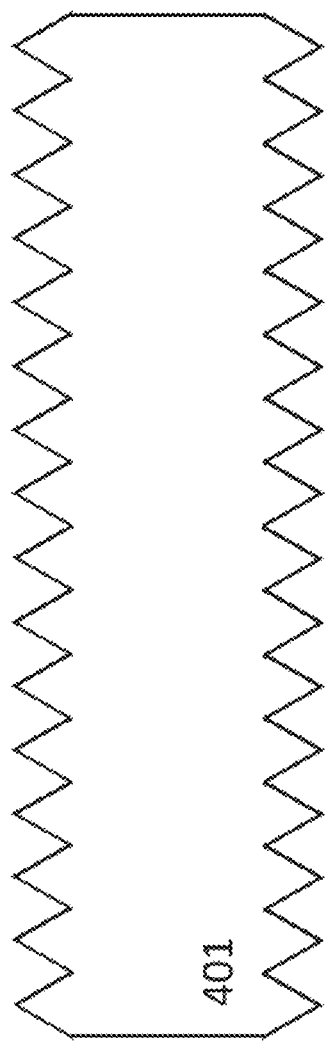
FIG. 4A shows the texturizing step.
Figure 4B:
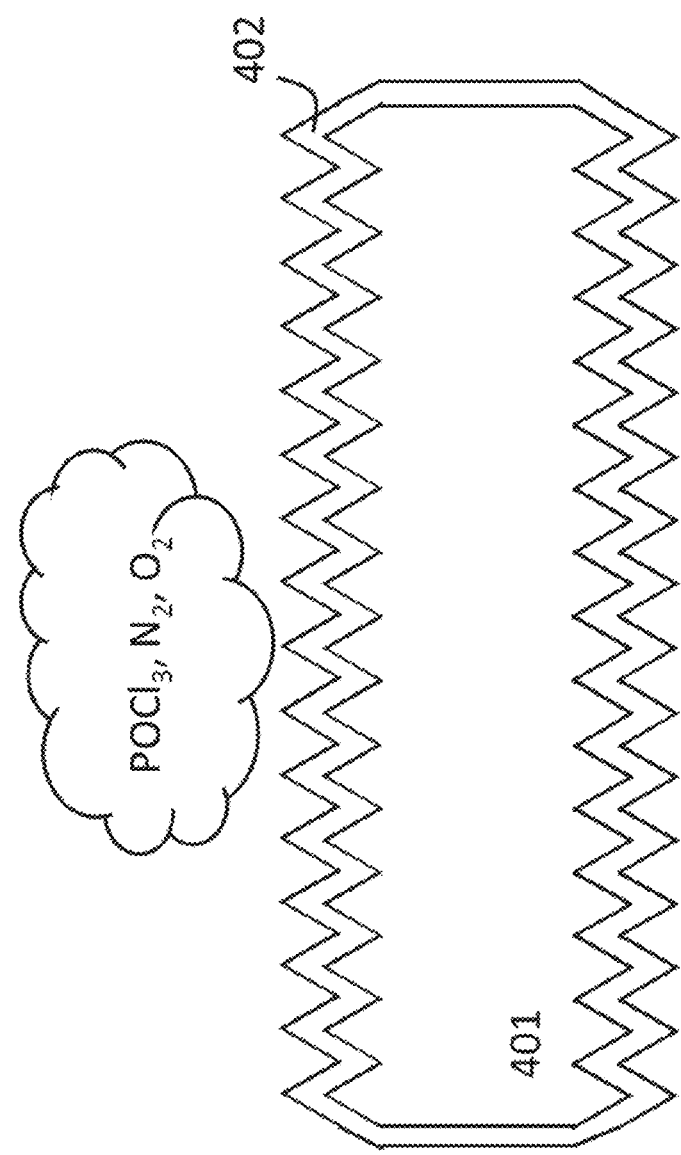
FIG. 4B shows the phosphorus diffusion step.
Figure 4E:
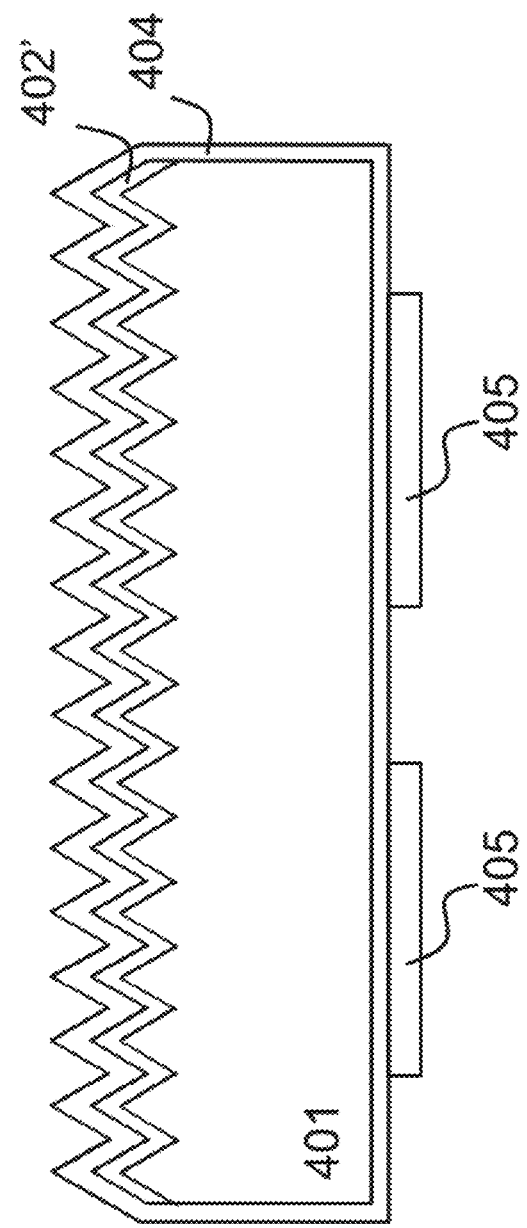
FIG. 4E shows printing step of the boron paste.
Figure 4F:
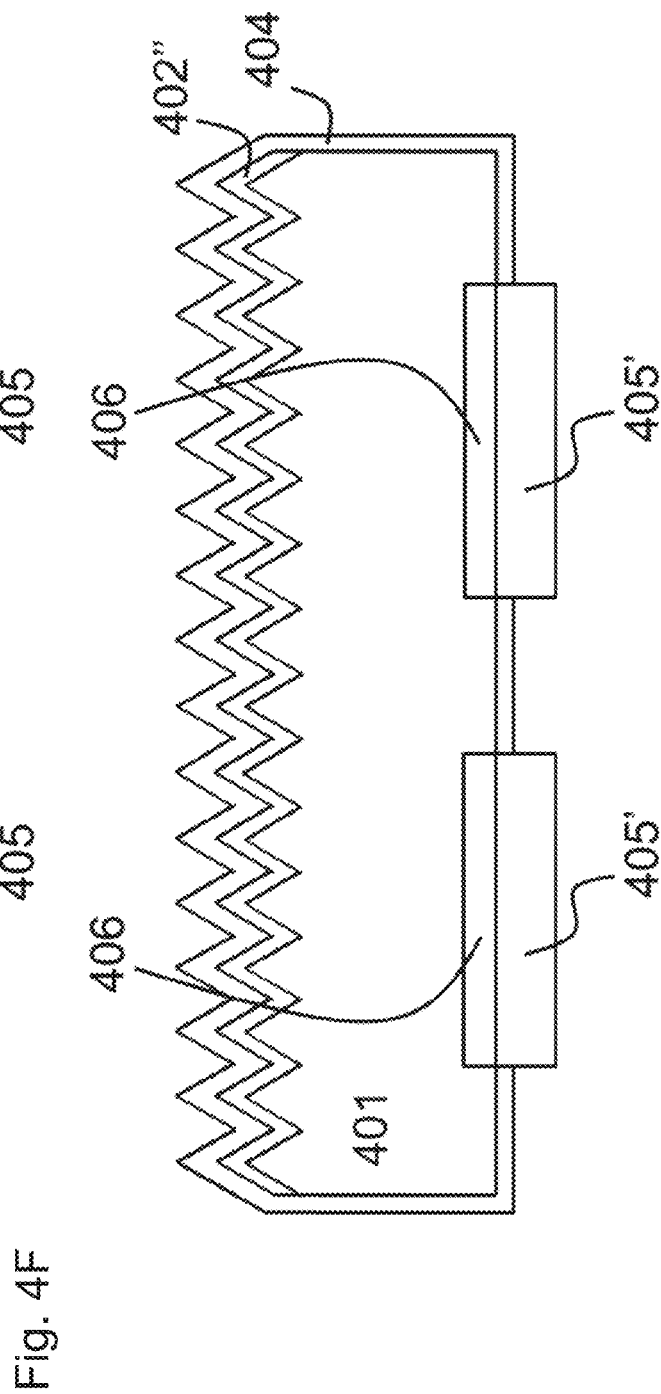
FIG. 4F shows the boron drive-in step.
Figure 4I:
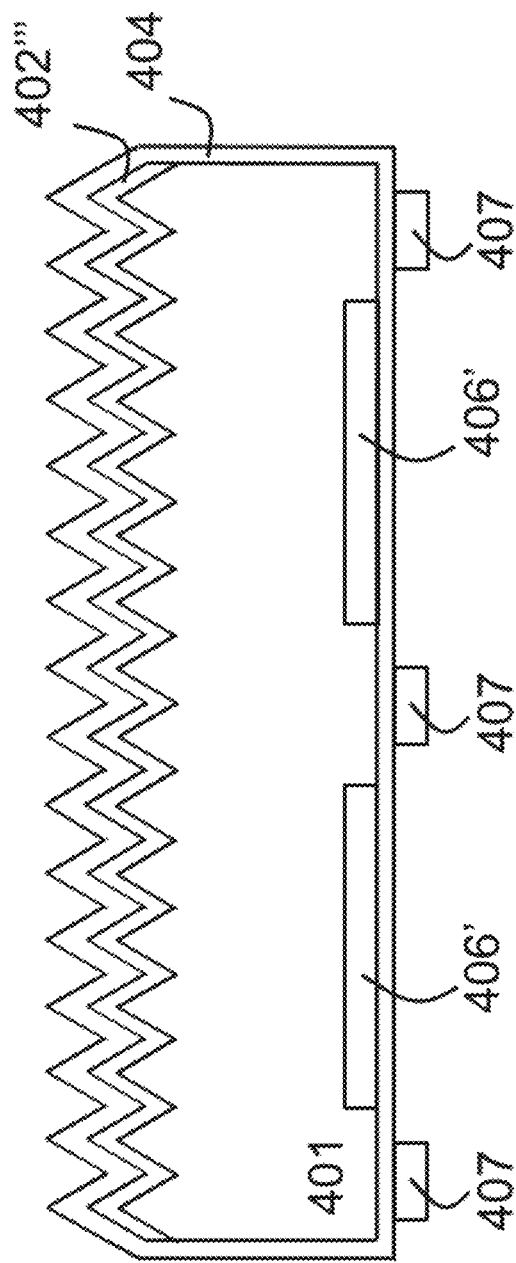
FIG. 4I shows the printing step of the phosphorus paste.
Figure 4J:
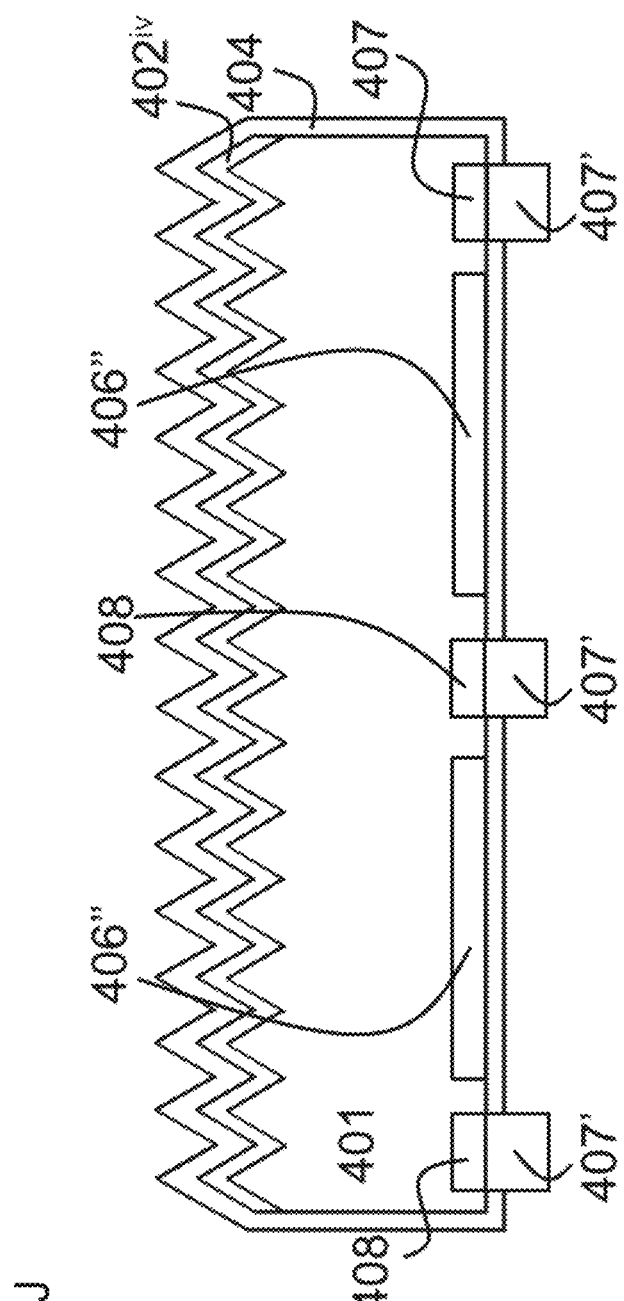
FIG. 4J shows the phosphorus drive-in step.
Figure 4M:
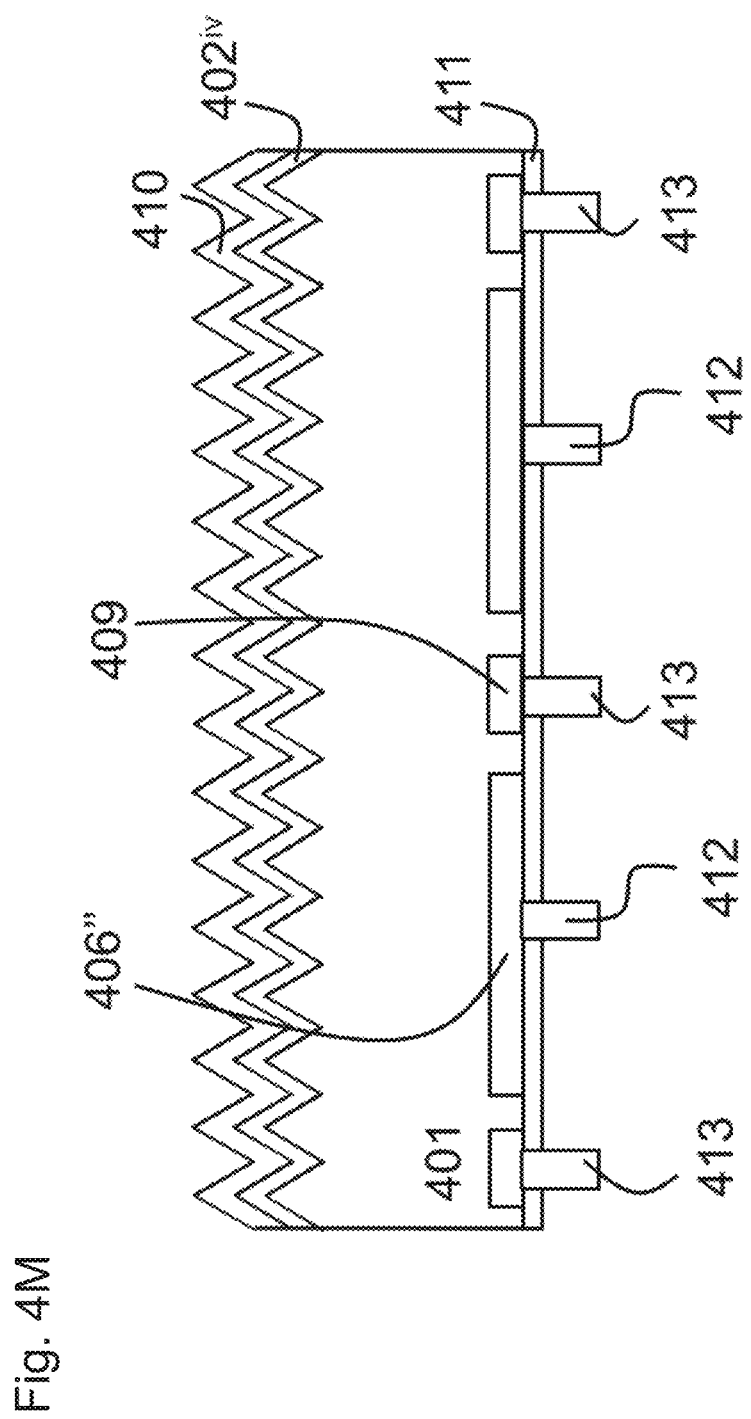
FIG. 4M shows the metallization (electrode-forming) step.
Figure 4Q:
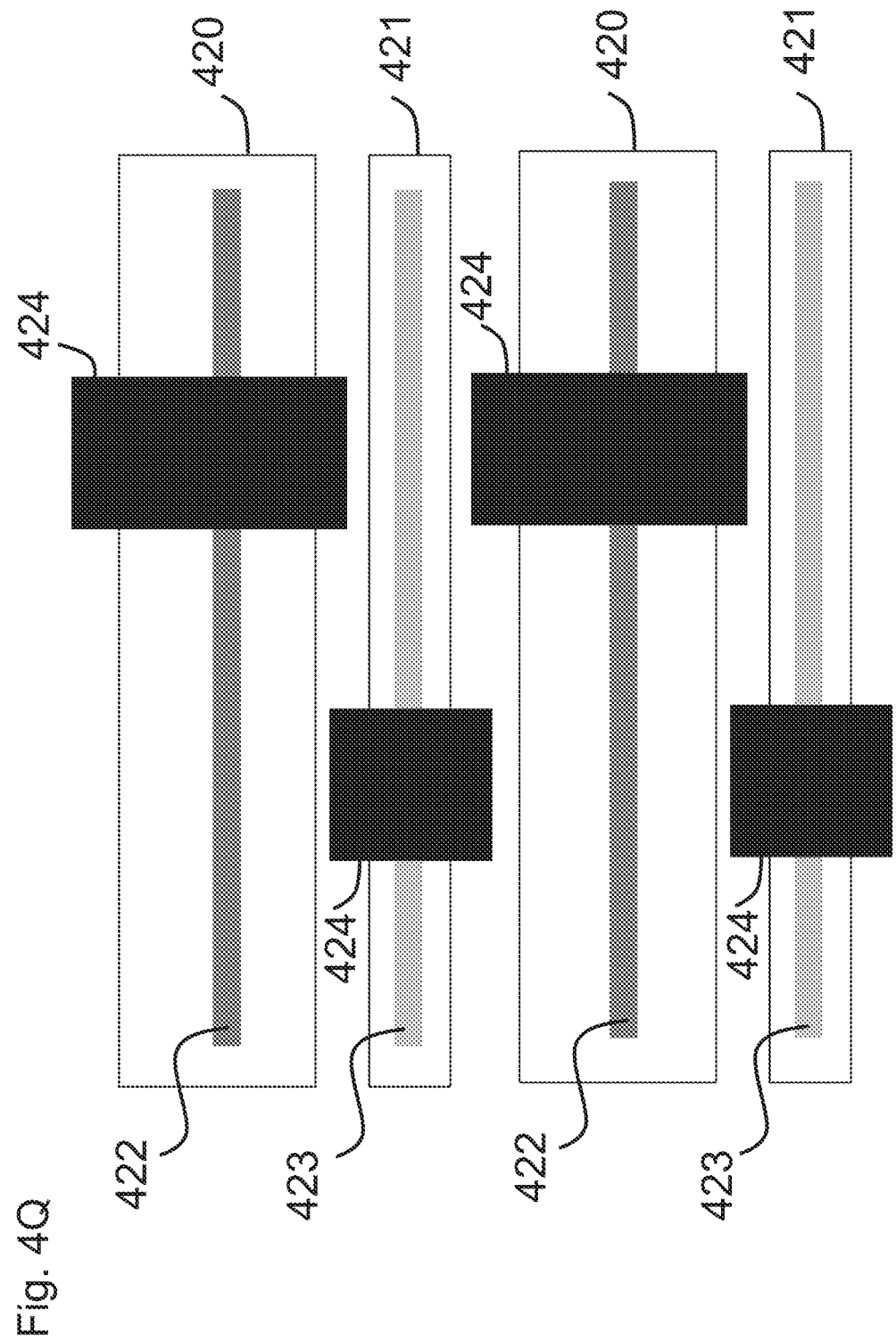
FIG. 4Q shows a pattern of the insulator layer.
Figure 4R:
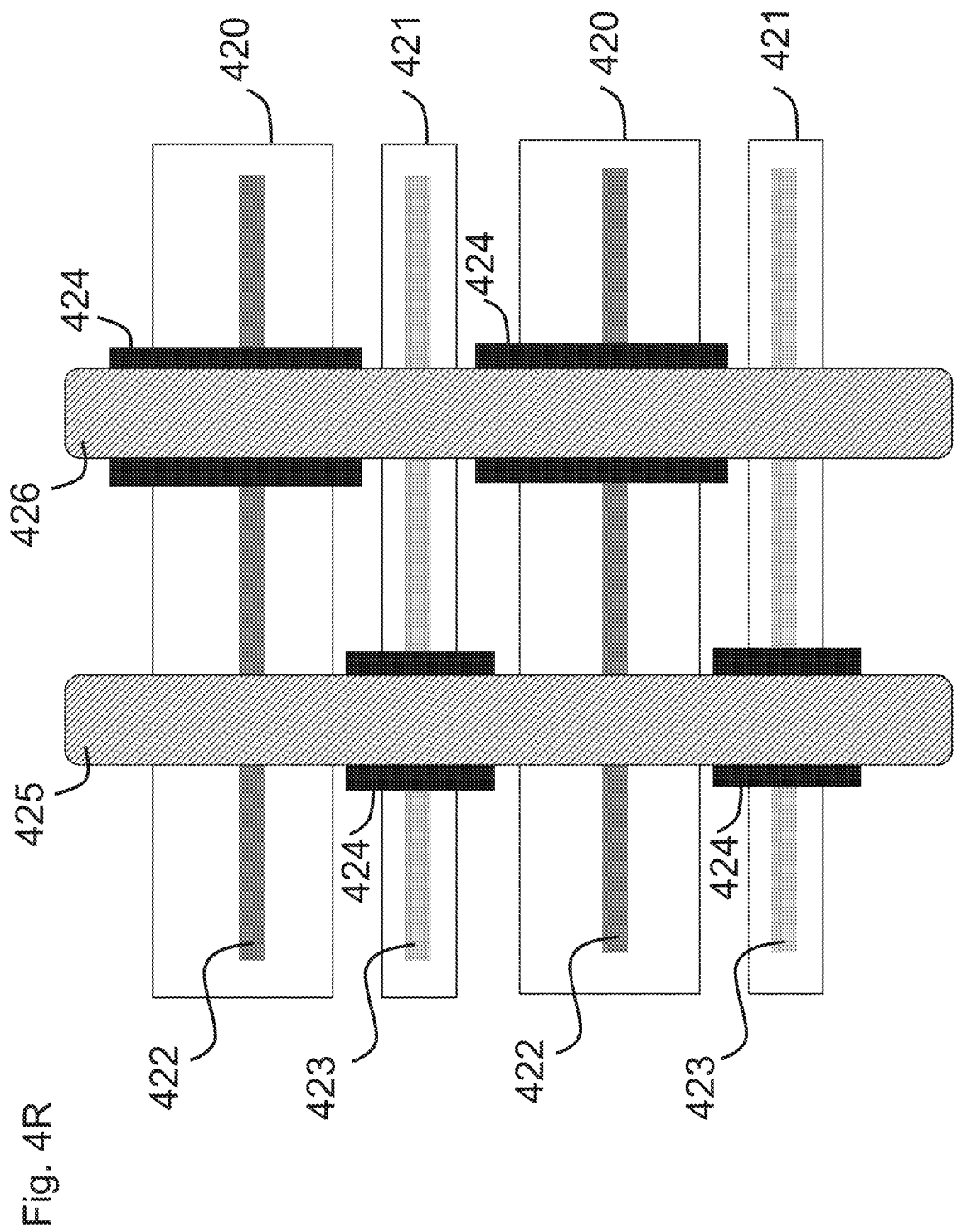
FIG. 4R shows a pattern of the metal busbars.

An embodiment for incorporating the doping-through-oxide approach to fabricate an IBC solar cell is shown in FIGS. 4A-4R.

The fabrication process may begin with a textured n-type silicon wafer (401) as shown in FIG. 4A. The silicon wafer is then subjected to a phosphorus diffusion process, like a $POCl_3$ diffusion process performed in a heated quartz tube furnace in a $POCl_3$, $N_2$ and $O_2$ ambient, forming an n+ layer (402) near the wafer surface as shown in FIG. 4B. Residual surface phosphosilicate glass from the phosphorus diffusion can be removed by submerging the wafer in a dilute HF solution.

The rear side phosphorus diffused layer can be removed using a single-sided wet chemistry etch process such as using a hydrofluoric acid, nitric acid, and sulfuric acid mixture, leaving behind an n-type rear surface (403) as shown in FIG. 4C.

Front side phosphorus diffusion can also be achieved using other methods including but not limited to: phosphoric acid spray process followed by a thermal drive-in step, front side PSG deposition using a chemical vapor deposition system followed by a thermal drive-in step, or an ion implantation process.

The wafer is then subjected to an oxidation process which grows a $SiO_2$ layer (404) on the surface of the wafer as shown in FIG. 4D. A thermal oxidation process may be used which typically employs a heated quartz tube furnace with an oxidizing ambient. This high temperature oxidation step will at the same time drive the phosphorus atoms in the existing front side n+ layer (shown as (402) in FIG. 4C) deeper into the wafer, thus creating a modified n+ layer shown as (402') in FIG. 4D. In the event a boron-doped substrate is used as the substrate (401), the doped layer (402 in FIG. 4C), which is doped with the same dopant as the dopant of the substrate (401), can be a p+ layer.

Alternatively, the oxide layer (404) may be formed by other methods such as (i) thermal oxidation, (ii) depositing a liquid composition comprising silicon dioxide particles (e.g. printing, spraying, dipping etc.), (iii) chemical vapor deposition, (iv) chemical oxidation, (v) steam oxidation, (vi) printing and oxidizing a composition comprising of silicon particles, and (vii) growing and oxidizing a porous silicon layer. In the cases of growing a chemical oxide or growing and oxidizing a porous silicon layer, the top heavily doped portion (closest to the wafer surface) of the existing front side n+ layer (shown as (402) in FIG. 4C) may be etched away thus creating a modified n+ layer similar to that achieved using a thermal drive-in process (shown as (402') in FIG. 4D). The thickness of the $SiO_2$ layer is 10 nm to 100 in an embodiment.

For the next step, shown in FIG. 4E, a boron-containing paste is screen printed onto the oxidized rear surface followed by a low temperature bake in order to drive off solvents from the paste to form a patterned boron-containing paste area (405). Other methods can be used for depositing the pastes instead of screen printing. The boron print will form the boron emitter after a subsequent thermal drive-in step.

The oxidized rear surface does not contain any via or any through hole that enables the direct contact of the pastes with the rear surface (403) of the substrate in an embodiment. As illustrated in FIG. 4E, the boron-containing paste is deposited on the $SiO_2$ layer and the boron diffuses into the silicon wafer in the following drive-in process.

The next step is a high temperature drive-in process. The process is performed in a quartz tube furnace in an $N_2$ ambient in an embodiment. During this high temperature step the boron paste locally reacts with oxide layer forming new boron source layers (405') which reach the underlying silicon wafer and locally dope to form the boron emitter (406) as shown in FIG. 4F.

The temperature of the drive-in process is 850° C. to 1000° C. in an embodiment. The time period of the drive-in process is 20 minutes to 2 hours in an embodiment.

This high temperature drive-in step can at the same time drive the phosphorus atoms in the existing front side n+ layer (shown as (402') in FIGS. 4D and 4E) deeper into the wafer thus creating a modified n+ layer shown as (402") in FIG. 4F in an embodiment. The next step is to remove the oxide layer and residual paste layers exposing the n+ layer (402") on the front side and the boron emitter (406) on the rear side as shown in FIG. 4G. The oxide layer can be removed by submerging the wafers in a dilute HF solution.

Boron diffusion processes are known to sometimes form an undesirable boron-rich layer (BRL) at the wafer surface. This BRL layer has been identified as boron silicide ($SiB_6$). In an embodiment, a BRL can be removed by subjecting the wafers to an oxidizing ambient between 600° C. and 800° C. The oxidized BRL layer can then be removed by submerging the wafers in a dilute HF solution.

The wafer is then subjected to another oxidation process which grows a $SiO_2$ layer (404) on the surface of the wafer as shown in FIG. 4H. A thermal oxidation process may be used which typically employs a heated quartz tube furnace with an oxidizing ambient. This high temperature oxidation step will at the same time further drive the phosphorus atoms in the existing front side n+ layer (shown as (402") in FIG. 4G) deeper into the wafer, thus creating a modified n+ layer shown as (402''') in FIG. 4H. Also, during the thermal oxidation the boron emitter (shown as (406) in FIG. 4G) will have its profile modified by both segregation of boron atoms into the oxide layer and by the high temperature of the process. These two effects will create a modified boron emitter (406') with a lower surface concentration and a deeper profile.

Alternatively, the oxide layer (404) may be formed by other methods such as (i) thermal oxidation, (ii) depositing a liquid composition comprising silicon dioxide particles (e.g. printing, spraying, dipping etc.), (iii) chemical vapor deposition, (iv) chemical oxidation, (v) steam oxidation, (vi) printing and oxidizing a composition comprising of silicon particles, and (vii) growing and oxidizing a porous silicon layer. The thickness of the $SiO_2$ layer is 10 nm to 100 in an embodiment.

For the next step, shown in FIG. 4I, a phosphorus-containing paste is screen printed onto the oxidized rear surface followed by a low temperature bake in order to drive off solvents from the paste to form a patterned phosphorus-containing paste area (407).

The oxidized rear surface does not contain any via or any through hole that enables the direct contact of the pastes with the rear surface (403) of the substrate in an embodiment. As illustrated in FIG. 4I, the phosphorus-containing paste is deposited on the $SiO_2$ layer and the phosphorus diffuses into the silicon wafer in the following drive-in process.

The next step is a high temperature drive-in process. The process is performed in a quartz tube furnace in an $N_2$ ambient in an embodiment. During this high temperature step the phosphorus paste locally reacts with oxide layer forming new phosphorus source layers (407') which reach the underlying silicon wafer and locally dope to form the phosphorus BSF (408) as shown in FIG. 4J.

The temperature of the drive-in process is 850° C. to 1000° C. in an embodiment. The time period of the drive-in process is 20 minutes to 2 hours in an embodiment.

This high temperature drive-in step will at the same time drive the phosphorus atoms in the existing front side n+ layer (shown as (402''') in FIGS. 4H and 4I) deeper into the wafer thus creating a yet further modified n+ layer shown as ($402^{iv}$) in FIG. 4J in an embodiment. This modified n+ layer ($402^{iv}$) is the FSF. Also during this high temperature step the boron atoms in the existing emitter regions (shown as 406' in FIG. 4I) are driven deeper into the wafer creating a modified boron emitter regions shown as (406") in FIG. 4J.

The next step is to remove the oxide layer and residual paste layers exposing the FSF ($402^{iv}$) on the front side, the boron emitter (406") and the phosphorus BSF (408) on the rear side as shown in FIG. 4K. The oxide layer can be removed by submerging the wafers in a dilute HF solution. The final interdigitated doped pattern on the rear side consists of three regions: the boron emitter (406"), the phosphorus BSF (408) and the non-doped regions commonly referred to as the gap, indicated as (409) in FIG. 4K. In an embodiment, the gap region can be eliminated.

The front and rear surfaces are subsequently coated with passivation layers (410) and (411), respectively, as shown in FIG. 4L. Such passivation films may comprise at least one of silicon nitride, aluminum oxide and silicon oxide. In some embodiments, the passivation film may be a stack structure comprising multiple, i.e. two or more layers. Such stack structure may include at least one layer comprising silicon nitride and at least one layer comprising one of silicon oxide and aluminum oxide. The passivation film may be prepared using a number of techniques. In some embodiments, the passivation film may be deposited using a chemical vapor deposition technique, such as plasma enhanced chemical vapor deposition (PECVD).

Passivation films deposited on the back and front surfaces of the substrate may be the same or different. In some embodiments, a passivation film on the back surface of the substrate may be thicker than the one on the front surface of the substrate, while in some other embodiments, a passivation film on the back surface of the substrate may be thinner than the one on the front surface of the substrate. A thickness of the passivation film may vary. In some embodiments, such thickness may be from 30 nm to 300 nm or from 50 nm to 250 nm or any value or subrange within these ranges.

The next step is to apply boron emitter metal contacts (412) and phosphorus BSF contacts (413), as shown in FIG. 4M. A process for forming the metal contacts (412, 413) is described below. However, the scope of the invention is not limited to the particular embodiment.

In one embodiment two different metal compositions are used for the emitter contact and the BSF contact. In another embodiment, the same metal composition is used for both the emitter contact and the BSF contact. In one embodiment, two metal compositions are deposited sequentially. In another embodiment, two metal compositions are deposited simultaneously. These metal contacts are deposited as patterns consisting of dots and/or lines. In order to describe the subsequent steps, FIGS. 4N-4R employ a two dimensional plane view of the rear side of the substrate.

FIG. 4N shows a series of two boron emitters indicated as (420) and a series of two phosphorus BSF regions indicated as (421). The boron emitter metal contact pattern is shown in FIG. 4O as lines (422). The next step is to deposit patterned BSF metal line contacts (423) as shown in FIG. 4P. In an embodiment, the contact for the phosphorus diffused region is a silver paste, containing organics for printability and traces of other metals or glass frits for etching SiN during the firing process. DuPont PV17x and DuPont PV16A are example products used for this application. In an embodiment, the contact for the boron diffused regions is a silver paste, containing over 80% or more silver powder by weight. The precise composition of the non-silver additives may be different from the phosphorus diffusion contact paste. DuPont PV3N1 is an example of the product used for this application. The conductor layers are fired at temperatures above 700° C. in a belt furnace to burn off the organic components in an embodiment, densify the silver line to increase conductivity, and activate the frits which etch the SiN.

The next step is to deposit a patterned insulator layer (424) which partly overlaps the line segments of both the emitter contacts (422) and BSF contacts (423) as shown in FIG. 4Q. The insulator regions will allow metal busbars of opposite polarity to that of the underlying doped region to traverse overtop these regions and avoid an electrical shunt path and thus allow carriers to be extracted from the solar cell. In an embodiment, the dielectric layer is composed of ceramic or oxide powders. In an embodiment, the dielectric layer is formed by screen printing a paste comprising ceramic powders or oxide powders and an organic vehicle. The organic vehicle may comprise a solvent and an organic binder for adjusting the printability. The paste melts and reflows at temperatures equal to or lower than the belt-furnace firing temperature to encapsulate the underlying conductor in an embodiment. There are many suitable compositions: compounds of boron, lead, and titanium and can be mixed with silica to achieve this. In contrast to the conductors, the glass materials in the dielectric paste are unable to etch SiN in an embodiment. DuPont 5415A is an example of a product used for this application. As an alternative to this ceramic or glass insulator material, a lower temperature polymer material could be used, such as DuPont 5018. Low temperature insulators cannot be fired simultaneously with the silver conductors.

The next step is to deposit metal busbars (425, 426) as shown in FIG. 4R. The same metal is used and therefore all regions can be deposited simultaneously in an embodiment. The emitter metal busbar (425) electrically connects all emitter metal fingers (422). The BSF metal busbar (426) electrically connects all BSF metal fingers (423). In an embodiment, the busbar metal is a silver paste comprising of mostly silver, with some organic additives. DuPont 5025 is an example product used for this application. Other, non-silver based metal pastes, can be used for the busbar. Depending on the choice of dielectric material, the busbar may be fired at high temperature like the contact conductors, or at low temperature like the insulator.

Various modifications can be made in the above method. In an embodiment, the phosphorus-containing paste is printed on the rear side of the solar cell after the boron emitter is formed. In contrast, the boron-containing paste may be printed on the rear side of the solar cell after the phosphorus BSF is formed.

Other modifications and improvements can be referred to. For example, patent applications such as U.S. patent application Ser. No. 13/602,919 filed on Sep. 4, 2012, U.S. patent application Ser. No. 13/795,191 filed on Mar. 6, 2013, U.S. patent application Ser. No. 13/661,515 filed on Oct. 26, 2012, US patent publication US20120145967 and US patent publication US20120280183 are incorporated by reference in their entirety to the same extent as if they were individually incorporated by reference. In an embodiment, p-type silicon wafer is used instead of n-type silicon wafer. Various modifications such as interchanging the $POCl_3$ diffusion process with a $BBr_3$ diffusion process can be employed for p-type silicon wafers.

Another embodiment for incorporating the doping-through-oxide approach to fabricate an IBC solar cell is shown in FIGS. 5A-M.

The fabrication process may begin with a textured n-type silicon wafer (501) as shown in FIG. 5A. The silicon wafer is then subjected to a phosphorus diffusion process, like a $POCl_3$ diffusion process performed in a heated quartz tube furnace in a $POCl_3$, $N_2$ and $O_2$ ambient, forming an n+ layer (502) near the wafer surface as shown in FIG. 5B. Residual surface phosphosilicate glass from the phosphorus diffusion can be removed by submerging the wafer in a dilute HF solution.

The rear side phosphorus diffused layer can be removed using a single-sided wet chemistry etch process using a hydrofluoric acid, nitric acid, and sulfuric acid mixture, leaving behind an n-type rear surface (503) as shown in FIG. 5C. Front side phosphorus diffusion can also be achieved using other methods including but not limited to: phosphoric acid spray process followed by a thermal drive-in step, front side PSG deposition using a chemical vapor deposition system followed by a thermal drive-in step, or an ion implantation process.

Figure 5D:
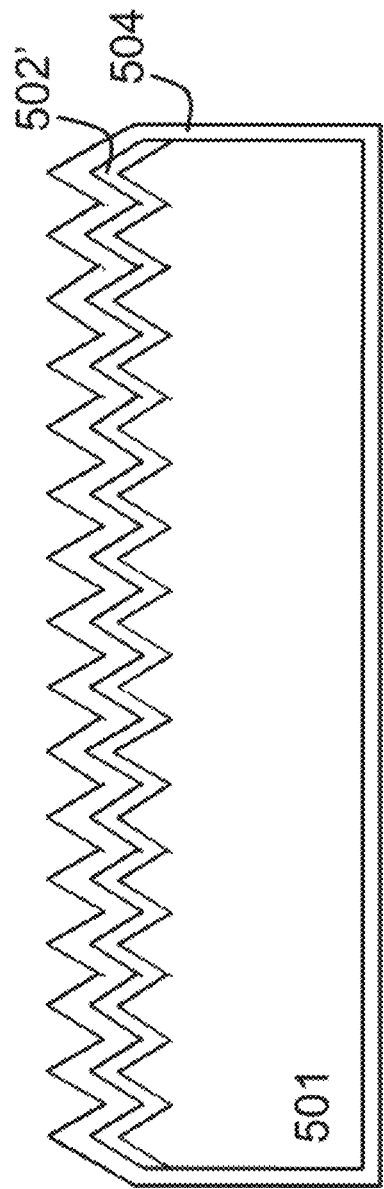
FIG. 5D shows the oxidation step.

The wafer is then subjected to an oxidation process which grows a $SiO_2$ layer (504) on the surface of the wafer as shown in FIG. 5D. A thermal oxidation process may be used which typically employs a heated quartz tube furnace with an oxidizing ambient. This high temperature oxidation step will at the same time drive the phosphorus atoms in the existing front side n+ layer (shown as (502) in FIG. 5C) deeper into the wafer, thus creating a modified n+ layer shown as (502') in FIG. 5D. In the event a boron-doped substrate is used as the substrate (501), the doped layer (502 in FIG. 5C), which is doped with the same dopant as the dopant of the substrate (501), can be a p+ layer.

Alternatively, the oxide layer (504) may be formed by other methods such as (i) thermal oxidation, (ii) depositing a liquid composition comprising silicon dioxide particles (e.g. printing, spraying, dipping etc.), (iii) chemical vapor deposition, (iv) chemical oxidation. (v) steam oxidation, (vi) printing and oxidizing a composition comprising of silicon particles, and (vii) growing and oxidizing a porous silicon layer. The thickness of the $SiO_2$ layer is 10 nm to 100 nm in an embodiment.

Figure 5E:
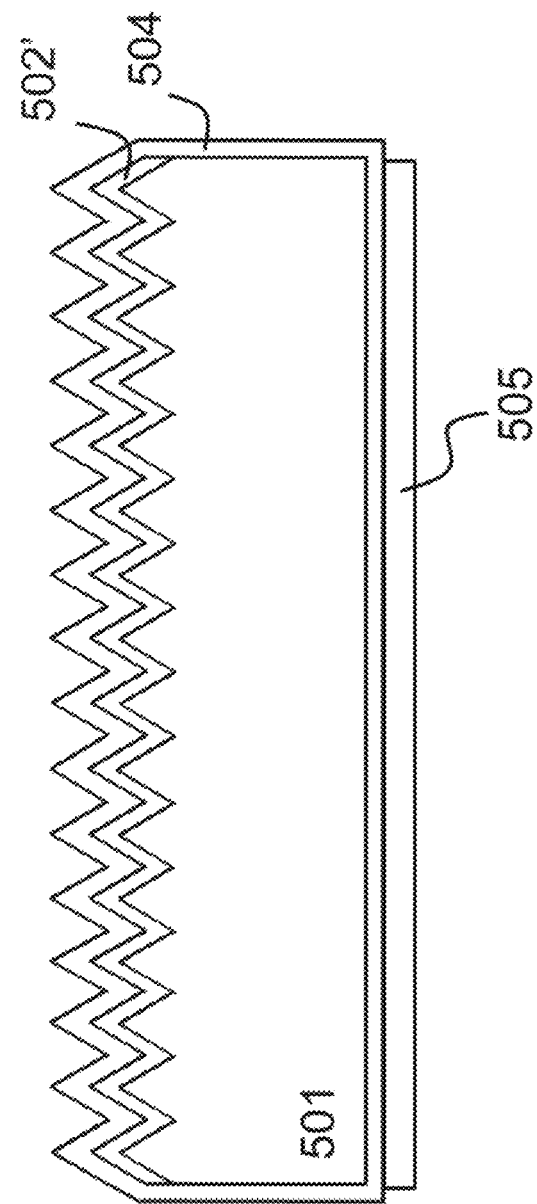
FIG. 5E shows the blanket deposition step of the boron paste.

For the next step, shown in FIG. 5E, a boron-containing paste is screen printed onto the oxidized rear surface in an unpatterned, blanket layer (505) followed by a low temperature bake in order to drive off solvents from the paste. The boron print will form a blanket pattern which after a thermal drive-in process will create a homogeneous boron emitter.

The oxidized rear surface does not contain any via or any through hole that enables the direct contact of the pastes with the rear surface (503) of the substrate in an embodiment. As illustrated in FIG. 5E, the boron-containing paste is deposited on the $SiO_2$ layer and the boron diffuses into the silicon wafer in the following drive-in process.

The next step is a high temperature drive-in process. The process is performed in a quartz tube furnace in an $N_2$ ambient in an embodiment. During this high temperature step the boron paste reacts with the oxide layer forming new boron source layer (505') which reaches the underlying silicon wafer and locally dopes to form the boron emitter (506) as shown in FIG. 5F.

The temperature of the drive-in process is 850° C. to 1000° C. in an embodiment. The time period of the drive-in process is 20 minutes to 2 hours in an embodiment.

This high temperature drive-in step can at the same time drive the phosphorus atoms in the existing front side n+ layer (shown as (502') in FIGS. 5D and 5E) deeper into the wafer thus creating a modified n+ layer shown as (502") in FIG. 5F in an embodiment.

The next step is to remove the oxide layer and residual paste layers exposing the n+ layer (502") on the front side and the boron emitter (506) on the rear side as shown in FIG. 5G. The oxide layer can be removed by submerging the wafers in a dilute HF solution.

The homogenous boron emitter can be created using different methods including, but not limited to: ion implantation, $BBr_3$ or $BCl_3$ diffusion used in conjunction with a barrier layer on the front side of the wafer, and depositing a single-side BSG layer using a chemical vapor deposition tool followed by a high temperature drive-in step.

Boron diffusion processes are known to sometime form an undesirable boron-rich layer (BRL) at the wafer surface. This BRL layer has been identified as boron silicide ($SiB_6$). In an embodiment a BRL can be removed by subjecting the wafers to an oxidizing ambient between 600° C. and 800° C. The oxidized BRL layer can then be removed by submerging the wafers in a dilute HF solution.

The wafer is then subjected to another oxidation process which grows a $SiO_2$ layer (504) on the surface of the wafer as shown in FIG. 5H. A thermal oxidation process may be used which typically employs a heated quartz tube furnace with an oxidizing ambient. This high temperature oxidation step will at the same time further drive the phosphorus atoms in the existing front side n+ layer (shown as (502") in FIG. 5G) deeper into the wafer, thus creating a modified n+ layer shown as (502''') in FIG. 5H. Also during the thermal oxidation the boron emitter (shown as (506) in FIG. 5G) will have its profile modified by both segregation of boron atoms into the oxide layer and by the high temperature of the process. These two effects will create a modified boron emitter (506') with a lower surface concentration and a deeper profile.

Alternatively, the oxide layer (504) may be formed by other methods such as (i) thermal oxidation, (ii) depositing a liquid composition comprising silicon dioxide particles (e.g. printing, spraying, dipping etc.), (iii) chemical vapor deposition, (iv) chemical oxidation, (v) steam oxidation, (vi) printing and oxidizing a composition comprising of silicon particles, and (vii) growing and oxidizing a porous silicon layer. The thickness of the $SiO_2$ layer is 10 nm to 100 in an embodiment.

For the next step, shown in FIG. 5I, a phosphorus-containing paste is screen printed onto the oxidized rear surface followed by a low temperature bake in order to drive off solvents from the paste to form a patterned phosphorus-containing paste area (507).

The oxidized rear surface does not contain any via or any through hole that enables the direct contact of the pastes with the rear surface (503) of the substrate in an embodiment. As illustrated in FIG. 5I, the phosphorus-containing paste is deposited on the $SiO_2$ layer and the phosphorus diffuses into the silicon wafer in the following drive-in process.

Figure 5J:
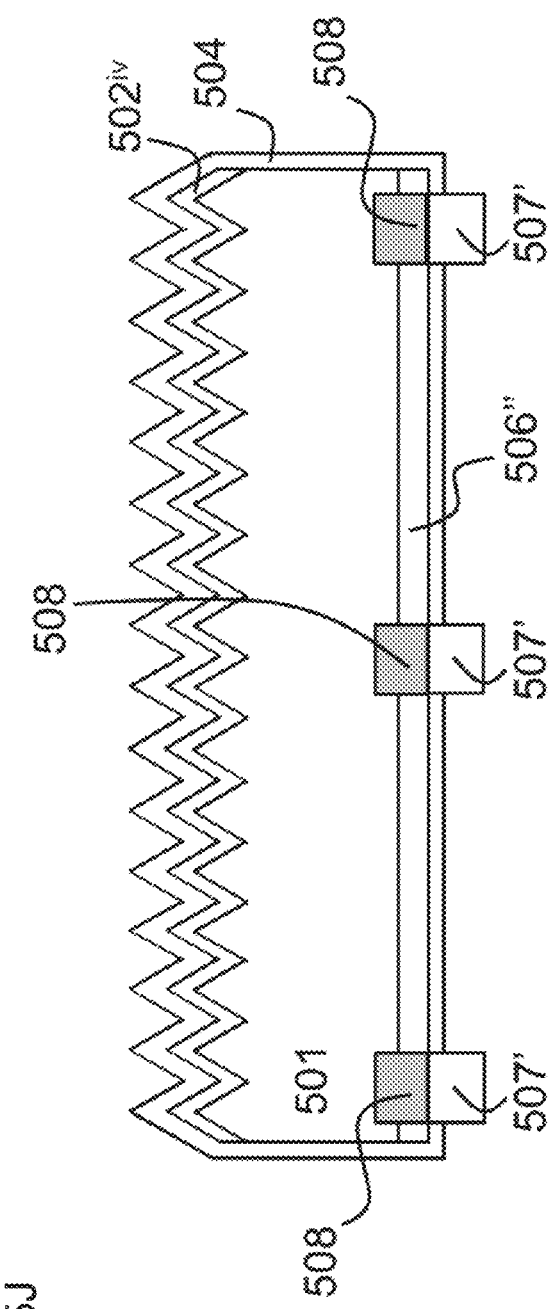
FIG. 5J shows the phosphorus drive-in step.

The next step is a high temperature drive-in process. The process is performed in a quartz tube furnace in an $N_2$ ambient in an embodiment. During this high temperature step the phosphorus paste locally reacts with oxide layer forming new phosphorus source layers (507') which reach the underlying silicon wafer and locally dope to form the phosphorus BSF (508) as shown in FIG. 5J. During this step the phosphorous diffusion will compensate the existing boron emitter (506') in the regions where phosphorous paste (507) is printed. The temperature of the drive-in process is 850° C. to 1000° C. in an embodiment. The time period of the drive-in process is 20 minutes to 2 hours in an embodiment.

This high temperature drive-in step can at the same time drive the phosphorus atoms in the existing front side n+ layer (shown as (502''') in FIGS. 5H and 5I) deeper into the wafer thus creating a yet further modified n+ layer shown as (502'') in FIG. 5J in an embodiment. This modified n+ layer (502''') is the FSF. Also during this high temperature step the boron atoms in the existing emitter regions (shown as 506' in FIG. 5I) are driven deeper into the wafer creating a modified boron emitter regions shown as (506'') in FIG. 5J. It should be noted that the phosphorus doping in the BSF regions (508) needs to be heavy enough to overcompensate the underlying boron doping (506'').

Figure 5K:
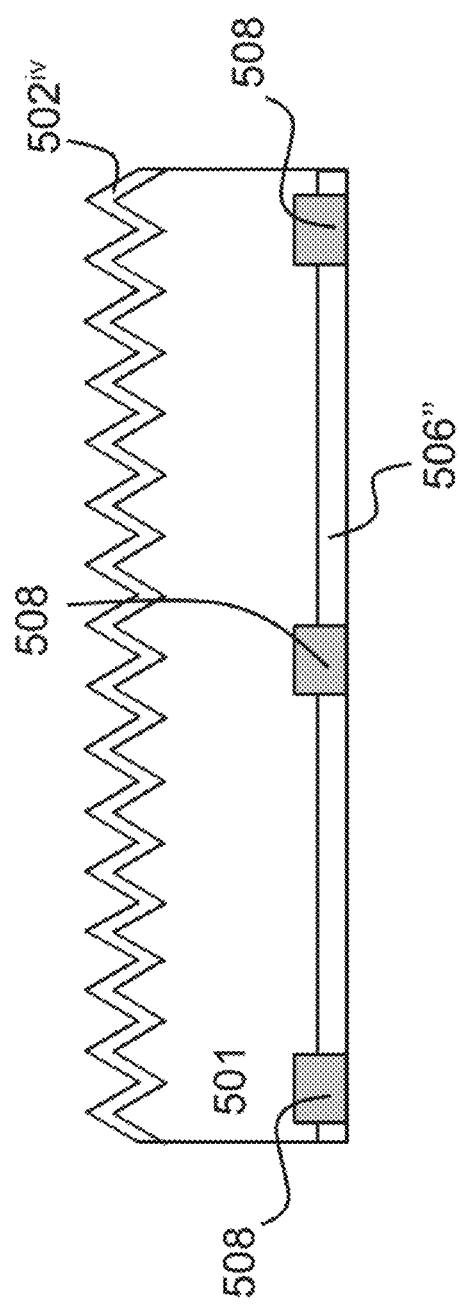
FIG. 5K shows the oxide layer stripping step.

The next step is to remove the oxide layer and residual paste layers exposing the FSF (502''') on the front side, the boron emitter (506'') and the phosphorus BSF (508) on the rear side as shown in FIG. 5K. The oxide layer can be removed by submerging the wafers in a dilute HF solution.

Figure 5L:
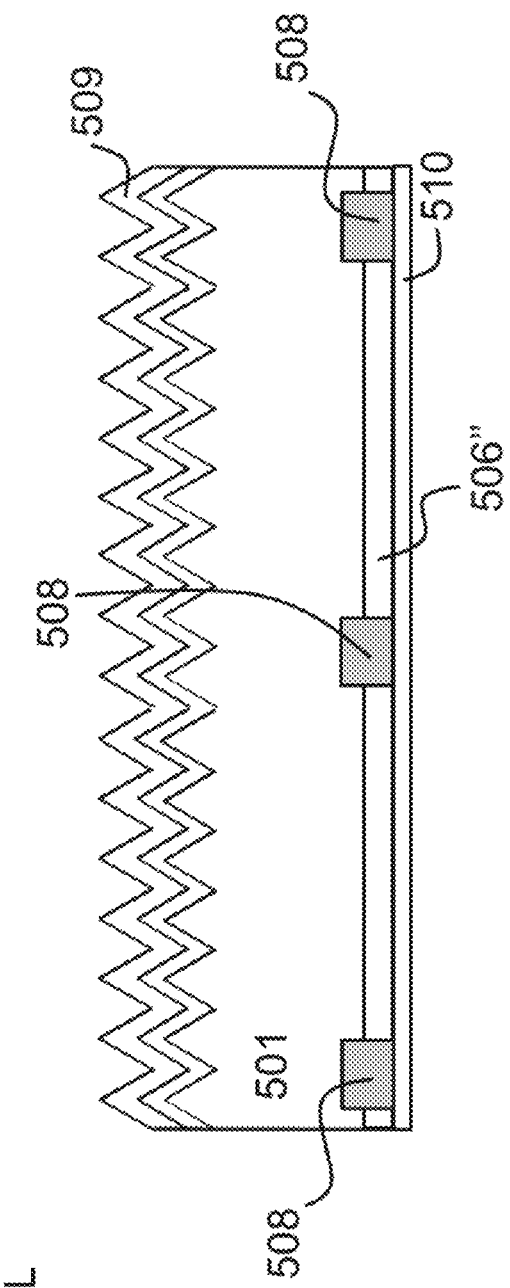
FIG. 5L shows the passivation step.

The front and rear surfaces are subsequently coated with passivation layers (509) and (510), respectively, as shown in FIG. 5L. Such passivation film may comprise at least one of silicon nitride, aluminum oxide and silicon oxide. In some embodiments, the passivation film may be a stack structure comprising multiple, i.e. two or more layers. Such stack structure may include at least one layer comprising silicon nitride and at least one layer comprising one of silicon oxide and aluminum oxide. The passivation film may be prepared using a number of techniques. In some embodiments, the passivation film may be deposited using a chemical vapor deposition technique, such as plasma enhanced chemical vapor deposition (PECVD). Passivation films deposited on the back and front surfaces of the substrate may be the same or different. In some embodiments, a passivation film on the back surface of the substrate may be thicker than the one on the front surface of the substrate, while in some other embodiments, a passivation film on the back surface of the substrate may be thinner than the one on the front surface of the substrate. A thickness of the passivation film may vary. In some embodiments, such thickness may be from 30 nm to 300 nm or from 50 nm to 250 nm or any value or subrange within these ranges.

Figure 5M:
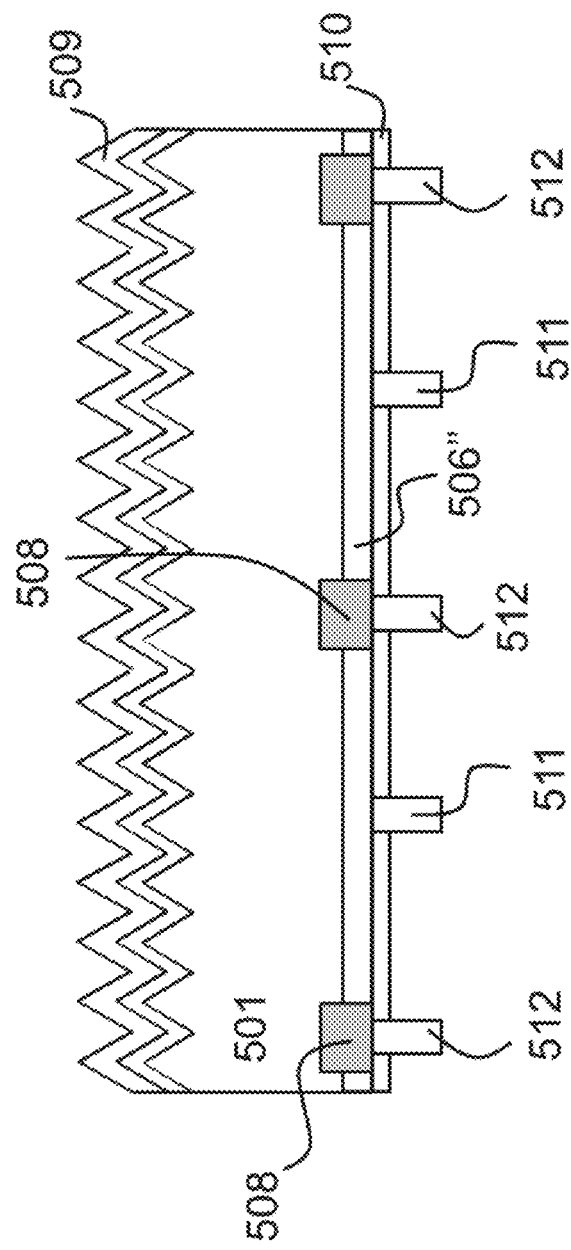
FIG. 5M shows the metallization (electrode-forming) step.

The next step is to apply boron emitter metal contacts (511) and phosphorus BSF contacts (512), as shown in FIG. 5M. The formation of the metal contacts is not limited to a particular process. In an embodiment, the metal contacts are formed as described above with reference to FIGS. 4N-4R.

There are several methods of depositing the boron-containing paste and phosphorus-containing paste. Screen printing, in particular, is beneficial for the deposition of the paste since it is commonly used in solar cell manufacturing for the deposition of front and rear metal pastes. For better printing efficiency and performance, the paste is preferred to be a non-Newtonian or shear-thinning fluid.

Non-Newtonian fluid refers to a fluid that has flow properties that are not described by a single constant value of viscosity, or resistance to flow. Shear thinning refers to a fluid which has a viscosity that decreases with increasing rate of shear. In general, shear thinning behavior is observed in colloidal suspensions, where the weak hydrostatic and electrostatic interaction between particles and their surface groups tends to increase viscosity in non-dynamic force regimes. The addition of a relatively small shear force overcomes the hydrostatic interaction and thus tends to reduce the viscosity of the fluid.

Consequently, the viscosity of the paste is preferred to be relatively low at high shear rates in order to pass through a screen pattern, but is also preferred to be relatively high prior to and after deposition (at low or zero shear rates), such that the paste will not run through the screen or on the substrate surface respectively.

Boron-containing paste comprises a boron compound; a polymer binder; a solvent, and optionally a ceramic compound. Phosphorus-containing paste comprises a phosphorus compound; a polymer binder; a solvent; and optionally a ceramic compound.

The boron compound includes, but not limited to, boron (B), boron nitride (BN), boron oxide ($B_2O_3$), boric acid ($B(OH)_3$), boron carbide ($B_4C$), boron silicide ($B_2Si$, $B_3Si$, $B_4Si$, $B_6Si$), boron-doped group IV nanoparticles (such as nc-Si:B), aluminum boride ($AlB_2$), barium boride ($BaB_6$), calcium boride (CaBt), cerium boride ($CeB_6$), chromium boride (CrB), cobalt boride ($Co_2B$—$Co_3B$), dysprosium boride ($DyB_4$, $DyB_6$), erbium boride ($ErB_4$), europium boride ($EuB_6$), gadolinium boride ($GdB_6$), hafnium boride ($HfB_2$), holmium boride ($HoB_4$), iron boride ($Fe_2B$), lanthanum boride ($LaB_6$), lutetium boride ($LuB_4$), magnesium boride ($MgB_2$), manganese boride (MnB, $MnB_2$), molybdenum boride (MoB), neodymium boride ($NdB_6$), nickel boride (NiB), niobium boride ($NbB_2$), praseodymium boride ($PrB_6$), rhenium boride ($Re_7B_3$), samarium boride ($SmB_6$), scandium boride ($ScB_2$), strontium boride ($SrB_6$), tantalum boride ($TaB_2$), terbium boride ($TbB_6$), thulium boride ($TmB_4$), titanium boride ($TiB_2$), tungsten boride (WB. $W_2B$, $W_2B_5$), vanadium boride ($VB_2$), ytterbium boride ($YbB_6$), and zirconium boride ($ZrB_2$, $ZrBi_2$).

The boron compound is between 0.5 and 50 wt % in an embodiment, and between 1 and 10 wt % in another embodiment, based on the total weight of the paste.

The phosphorus compound includes, but not limited to, salts of linear phosphoric acids $H(O-PO(OH))_nOH$, where $n \geq 1$, and amount of substituent cations $X \leq n+2$; salts of cyclic phosphoric acids $(O-PO(OH))_n$, where $n \geq 3$, and amount of substituent cations $X \leq n$, mono- and di-substituted salts of phosphoric acid $HPO(OH)_2$, and salt of hypophosphorus acid $H_2PO(OH)$; and substituent cations X are ammonium, its organic derivatives, and metal cations, preferably Al, Ba, Ca, Ce, Mg, Hf, Ta, Ti, Zr, La.

The phosphorus compound is between 20 and 90 wt % in an embodiment, and between 40 and 70 wt % in another embodiment, based on the total weight of the paste.

A ceramic compound may be included in the paste. During the high temperature diffusion process, boron and phosphorus are allowed to diffuse into the substrate, while the diffusion of ambient materials may be blocked or substantially reduced by the ceramic material. In an embodiment, the ceramic compound is selected in terms of compatibility with the silicon substrate. Some of the oxide materials in contact with silicon at an elevated temperature may get reduced introducing impurities into the wafer.

The ceramic compound include, but not limited to, SiN, $SiO_2$, SiC, $TiO_2$, $Al_2O_3$, MgO, CaO, $Li_2O$, BeO, SrO, $Sc_2O_3$, $Y_2O_3$, $La_2O_3$, $CeO_2$, $Ce_2O_3$, $Pr_2O_3$, $Nd_2O_3$, $Sm_2O_3$, EuO, $Gd_2O_3$, $Ta_2O_5$, $Tb_2O_3$, $Dy_2O_3$, $Ho_2O_3$, $Er_2O_3$, $Tm_2O_3$, $Yb_2O_3$, $Lu_2O_3$, $ThO_2$, $UO_2$, $ZrO_2$ and $HfO_2$. In an embodiment, the ceramic compound is selected from the group consisting of silicon oxide ($SiO_2$) titanium oxide ($TiO_2$), aluminum oxide ($Al_2O_3$), magnesium oxide (MgO), tantalum oxide ($Ta_2O_5$), and zirconium oxide (ZrO2), and combinations thereof.

In an alternate configuration, the particle surface of the ceramic compound may be treated with a ligand or capping agent in order to disperse in a set of solvents and optimize shear thinning behavior. In general, a capping agent or ligand is a set of atoms or groups of atoms bound to a "central atom" in a polyatomic molecular entity. The capping agent is selected for some property or function not possessed by the underlying surface to which it may be attached.

For the selection and modification of the ceramic compound, publicly available paper such as K. J. Hubbard and D. G. Schlom, Thermodynamic stability of binary metal oxides in contact with Silicon, J. Mater. Research, v 11(11), 1996) and prior patent application such as US Utility Patent Publication US20120280183 can be referred to.

The ceramic compound is between 0 and 50 wt % in an embodiment, between 3 and 40 wt % in another embodiment, 5 and 30 wt % in still another embodiment, based on the total weight of the paste.

A polymer binder may be included in the paste in order to optimize viscoelastic behavior of the paste for screen printing. The polymer binder includes, but is not limited to, polyacrylates, polymethacrylate, polyacetals and their derivatives (e.g. methyl, ethyl, butyl), polyvinyls, a cellulose (including its ethers and esters), and copolymers thereof. Two or more types of the polymer binder can be used in mixture.

The polymer binder is between 0.5 and 10 wt % in an embodiment, between 0.5 and 3 wt % in another embodiment, and between 0.75 and 2 wt % in still another embodiment, based on the total weight of the paste.

The component of the paste can be dispersed in a solvent, such as alcohols (e.g. terpineol), aldehydes, ketones (e.g. cyclohexanone), carboxylic acids, esters, amines, organosiloxanes, halogenated hydrocarbons, and other hydrocarbon solvents. In addition, the set of solvents may be mixed in order to optimize physical characteristics such as viscosity, density, polarity, etc.

For the purposes of this disclosure and unless otherwise specified, "a" or "an" means "one or more." All patents, applications, references and publications cited herein are incorporated by reference in their entirety to the same extent as if they were individually incorporated by reference.

The invention has been described with reference to various specific and illustrative embodiments. However, it should be understood that many variations and modifications may be made while remaining within the spirit and scope of the invention.

EXAMPLES

Experiment 1

A set of 156 mm pseudo square, 180 micron thick, n-type, 5 Ohm-cm silicon wafers were oxidized in a quartz furnace at 1000° C. in an oxidizing ambient for 60 minutes creating an oxide layer of approximately 50 nm on both sides of the wafers. The oxidized wafers were screen printed with a phosphorus-containing paste using a first pattern. Printed wafers were subsequently baked in air at 170° C. for approximately 1 minute.

Wafers were then loaded into a quartz tube furnace and subjected to a temperature of about 925° C. for 60 minutes in an $N_2$ ambient. The wafers were then dipped in a dilute hydrofluoric acid and hydrochloric acid solution to remove the oxide layer. Wafers were cleaned in a hot mixture of $H_2O_2$, HCl and water, followed by HF:HCl to remove any residual phosphorus-containing paste and to clean the wafer surface for the next oxidation step.

Wafers were then oxidized in a quartz furnace at 1000° C. in an oxidizing ambient for 60 minutes creating an oxide layer of approximately 50 nm on both sides of the wafers. The oxidized wafers were screen printed with a boron-containing paste using a second pattern wherein the first pattern and the second pattern collectively form an interdigitated pattern.

Printed wafers were subsequently baked in air at 170° C. for approximately 1 minute. Wafers were then loaded into a quartz tube furnace and subjected to a temperature of about 925° C. for 60 minutes in an $N_2$ ambient. The wafers were then dipped in a dilute hydrofluoric acid and hydrochloric acid solution to remove the oxide layer. Wafers were cleaned in a hot mixture of $H_2O_2$. HCl and water, followed by HF:HCl to remove any residual boron-containing paste.

Figure 6:
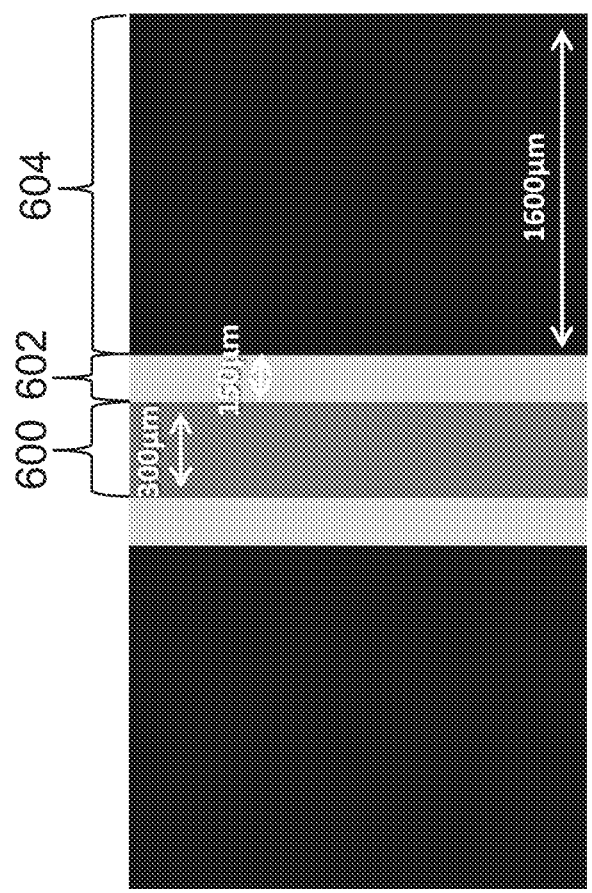
FIG. 6 shows a schematic view of the interdigitated pattern in Experiment 1.

FIG. 6 shows a schematic of the interdigitated pattern where the boron emitter region is indicated as (604), the non-printed region is indicated as (602) and phosphorus BSF region is indicated as (600). The boron emitter regions (604) were approximately 1600 microns wide. The non-printed or gap regions (602) were approximately 150 microns wide. The phosphorus BSF regions (600) were approximately 300 microns wide. Boron and phosphorus SIMS profiles were measured in the center of regions (600), (602), and (604). An additional SIMS profile was also measured on the far edge of region (604) adjacent to non-printed region (602).

Figure 7A:
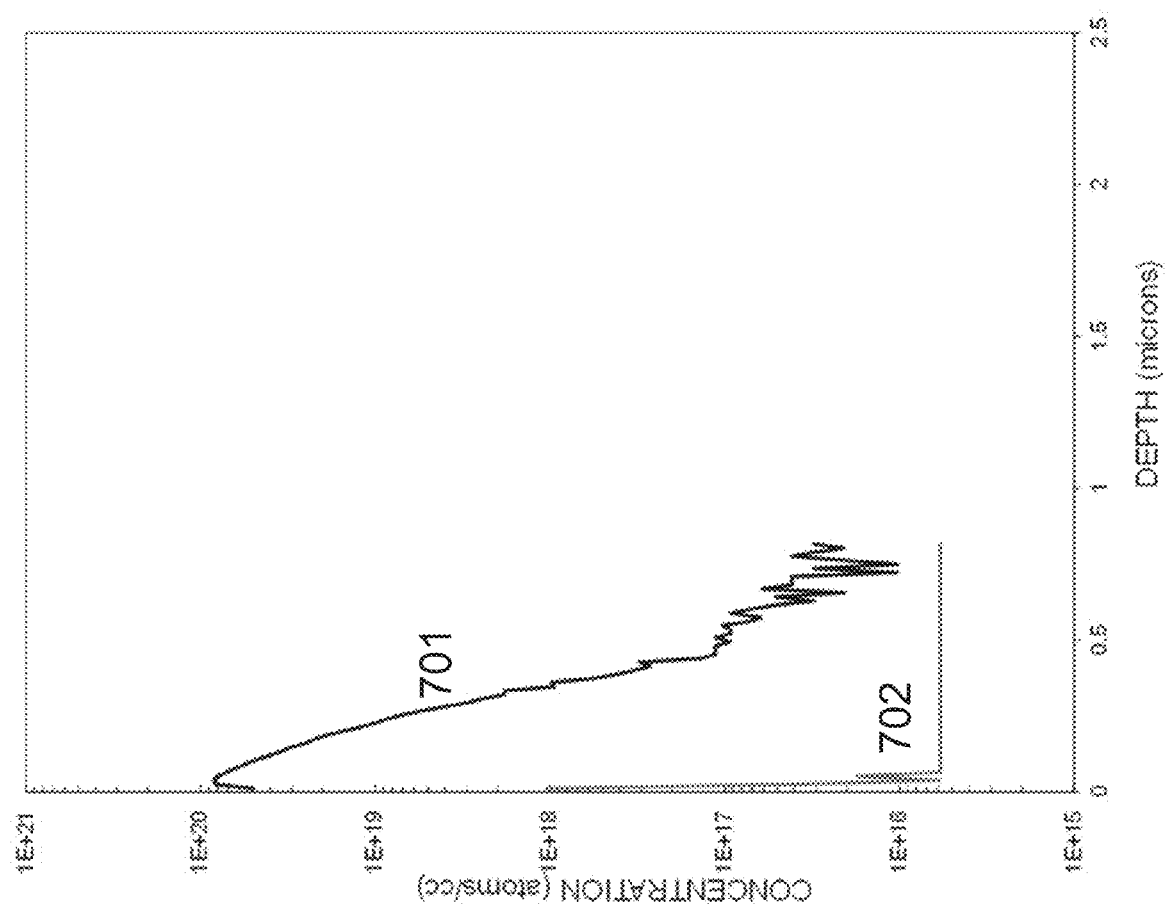
FIG. 7A shows the boron and phosphorus SIMS profiles in the center of the boron paste printed area corresponding to the emitter region.
Figure 7B:
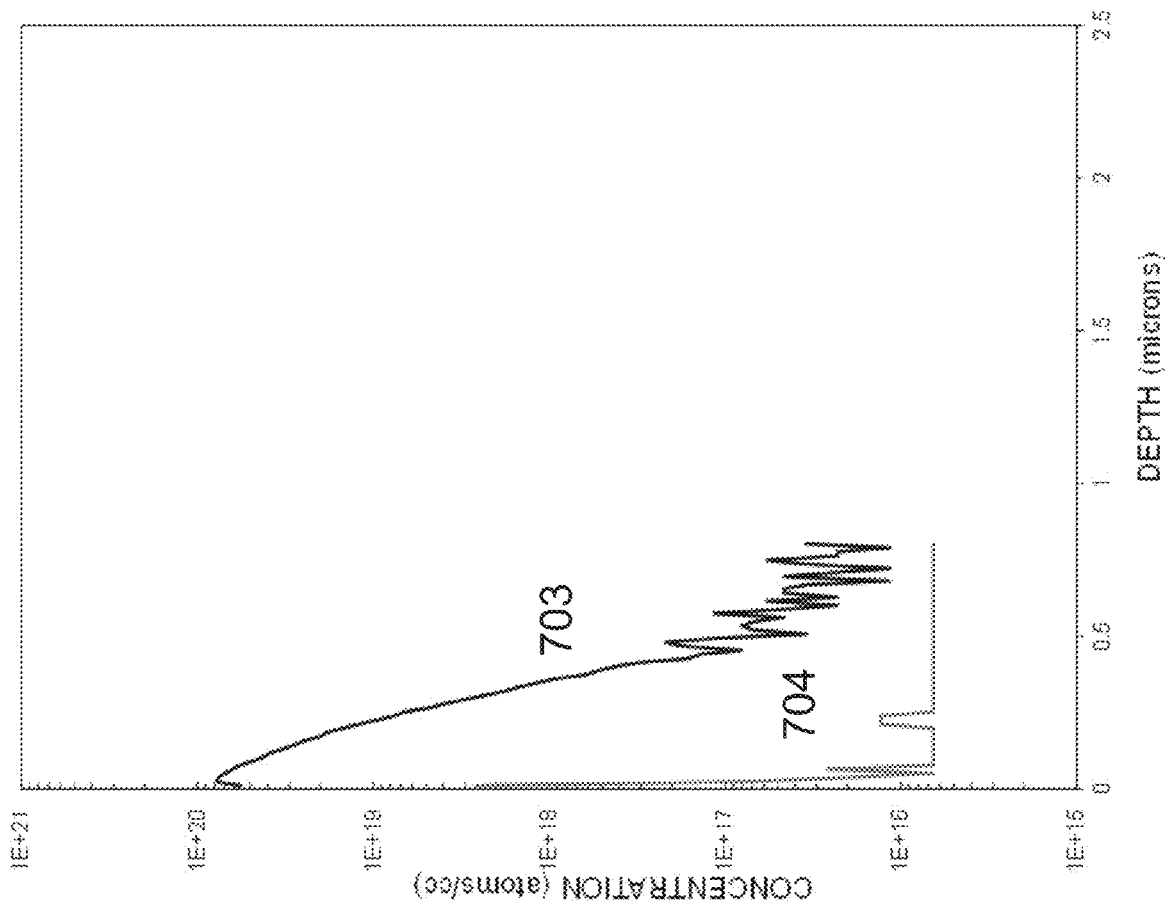
FIG. 7B shows the boron and phosphorus SIMS profiles in the far edge of the boron printed region.

The SIMS profiles measured in the center of the boron-containing paste printed area (604) corresponding to the emitter region are shown in FIG. 7A with the boron profile indicated as (701) and the phosphorus profile indicated as (702). The SIMS profiles measured in the far edge of the boron printed region (604) adjacent to the non-printed region (602) are shown in FIG. 7B with the boron profile indicated as (703) and the phosphorus profile indicated as (704). It is clear from FIGS. 7A and 7B that there are negligible phosphorus signals ((702) and (704)) indicating that localized boron doping has been achieved in the boron emitter region.

Figure 7C:
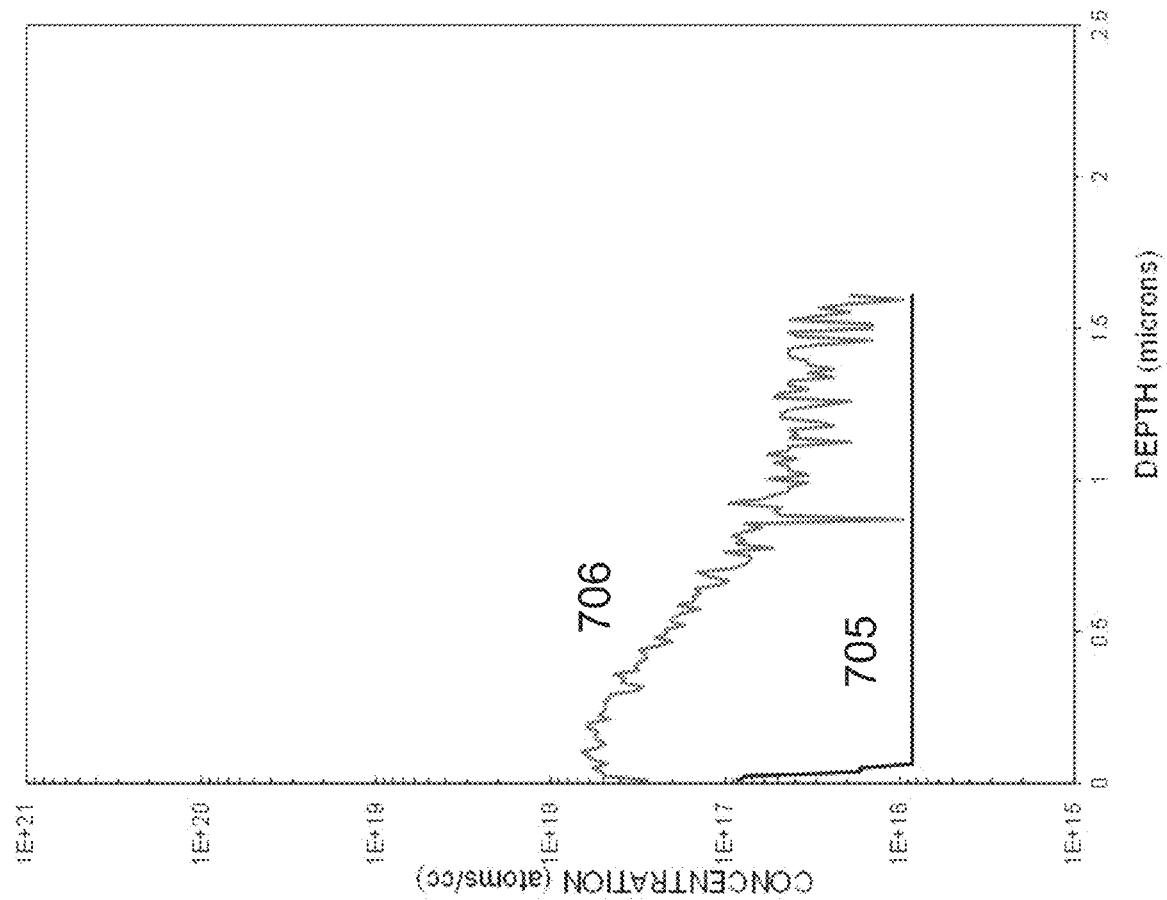
FIG. 7C shows the boron and phosphorus SIMS profiles in the center of the non-printed region corresponding to the gap area.

The SIMS profiles measured in the center of the non-printed region (602) corresponding to the gap are shown in FIG. 7C with the boron profile indicated as (705) and the phosphorus profile indicated as (706). Profiles (705) and (706) show that both boron and phosphorus doping has been suppressed in the non-printed region (602) indicating that localized doping was achieved.

Figure 7D:
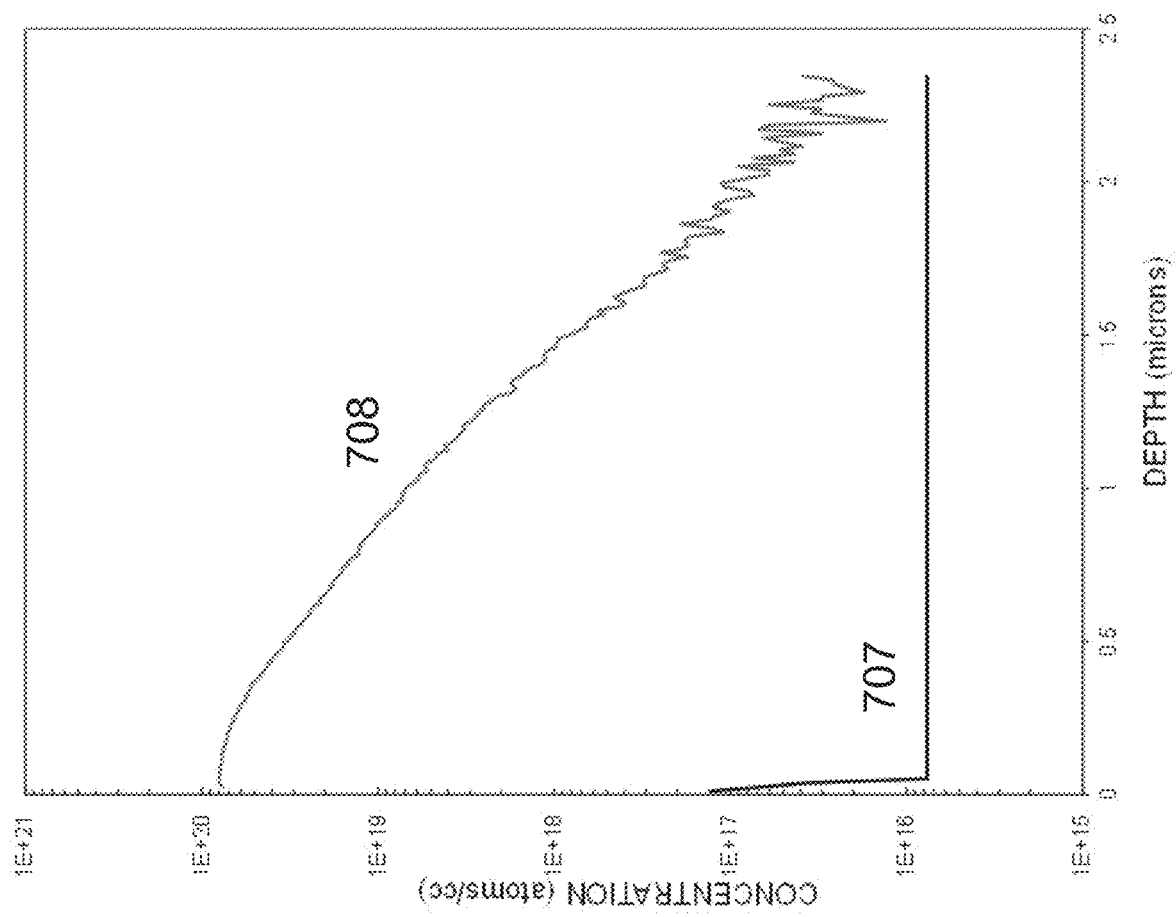
FIG. 7D shows the boron and phosphorus SIMS profiles in the center of the phosphorus paste printed area corresponding to the BSF region.

The SIMS profiles measured in the center of the phosphorus-containing paste printed area (600) corresponding to the BSF region are shown in FIG. 7D with the boron profile indicated as (707) and the phosphorus profile indicated as (708). It is clear from FIG. 7D that the boron signal (707) is negligible indicating that localized phosphorus doping was achieved in the BSF region (600).

Experiment 2

Monocrystalline 156 mm pseudo-square n-type silicon wafers, 180 um thick, were textured in a KOH solution to form random pyramid texture for enhanced light trapping. Next, after chemical cleaning, the wafers were loaded in the quartz tube furnace, and they were diffused in the $N_2:O_2$:$POCl_3$ ambient at 810° C. for 20 min to form phosphorous doped layers at the wafer surfaces. Then, the diffused layer was etched from the rear side of the wafer in the mixture of nitric acid, hydrofluoric (HF) acid and water, using silicon nitride as a mask on the front side of the wafer. Further, after removal of the etch mask in a mixture of hydrofluoric acid (HF), hydrochloric acid (HCl), and water, the wafers were oxidized in a quartz furnace at 1000° C. in a dry oxidizing ambient for 120 minutes creating an oxide layer of approximately 80 nm on both sides of the wafers.

The oxidized wafers were screen printed with a boron-containing paste to form a first pattern of lines (approximately 700 um wide with a pitch of 1.2 mm) on the rear side of the wafer. Printed wafers were subsequently baked in air at 170° C. for approximately 1 minute.

Wafers were then loaded into a quartz tube furnace and subjected to a temperature of about 950° C. for 60 minutes in an $N_2$ ambient. The wafers were then dipped in a mixture of HF, HCl and water to remove the oxide layer. Wafers were further cleaned in a hot mixture of $H_2O_2$, HCl and water, followed by HF:HCl to remove any residual boron paste and to clean the wafer surface for the next oxidation step.

Subsequently, the wafers were oxidized in a quartz furnace at 855° C. in a wet oxidizing ambient for 60 minutes creating an oxide layer of approximately 50 nm on both sides of the wafers. Then the oxidized wafers were screen printed with a phosphorous-containing paste using a second pattern with 300 um wide fingers, wherein the first pattern and the second pattern collectively form an interdigitated pattern. Printed wafers were subsequently baked in air at 170° C. for approximately 1 minute.

Wafers were then loaded into a quartz tube furnace and subjected to a temperature of about 905° C. for 60 minutes in an $N_2$ ambient. The wafers were then dipped in a mixture of HF, HCl and water to remove the oxide layer. Wafers were cleaned in a hot mixture of $H_2O_2$, HCl and water, followed by HF:HCl to remove any residual phosphorous paste.

Further, silicon nitride passivation layers, about 80 nm thick with a refractive index of 2.1, were deposited on the front and the rear side of the wafers.

Next, metal contacts were deposited on the rear side of the wafers. The widths of printed metal fingers were about 100 um and 150 um, respectively. Subsequently the wafers were fired in a belt firing furnace at a peak temperature of about 800 C. Next, a pattern of dielectric insulation material was double-printed onto the rear side of the wafer, followed by Ag paste busbars, which were aligned to the dielectric pattern. The role of the dielectric is to provide electrical insulation between the fingers and the busbars of the opposite polarity. Table 1 shows solar cell efficiency results, obtained under simulated AM 1.5G spectrum.

TABLE 1

Measured efficiency from the lot of 13 solar cells.

| Condition | Voc (mV) | Jsc (mA/cm2) | FF (%) | Efficiency (%) |
|---|---|---|---|---|
| Best Cell | 644.5 | 39.92 | 77.34 | 19.8 |
| Average | 642.1 | 39.79 | 77.1 | 19.7 |
| Standard Deviation | 1.3 | 0.09 | 0.24 | 0.06 |

What is claimed is:

1. A method for manufacturing an interdigitated back contact solar cell, comprising steps of:
   (a) providing a doped silicon substrate, the substrate comprising a front, sunward facing, surface and a rear surface;
   (b) doping the rear surface of the substrate homogeneously with boron in a first pattern, thereby forming a p+ region on the rear surface of the silicon substrate, wherein the first pattern is a blanket pattern;
   (c) forming a silicon dioxide layer on the front surface and the rear surface;
   (d) depositing a phosphorus-containing doping paste on the rear surface in a second pattern, wherein the phosphorus-containing doping paste comprising a phosphorus compound and a solvent;
   (e) heating the silicon substrate in an ambient to a temperature and for a time period in order to locally diffuse phosphorus into the rear surface of the silicon substrate, thereby forming an n+ region on the rear surface of the silicon substrate through the second pattern, wherein the p+ region and the n+ region on the rear surface collectively form an interdigitated pattern; and
   (f) removing the silicon dioxide layer from the silicon substrate.

2. A method of claim 1, wherein the rear surface of the substrate is doped with boron by a method selected from the group consisting of deposition of boron-containing doping paste followed by a thermal drive-in step, ion implantation, $BBr_3$ diffusion, $BCl_3$ diffusion, and BSG deposition using chemical vapor deposition followed by a thermal drive-in step.

3. A method of claim 1, wherein the silicon dioxide layer is formed by a method selected from the group consisting of (i) thermal oxidation, (ii) depositing a liquid composition comprising silicon dioxide particles, (iii) chemical vapor deposition, (iv) chemical oxidation, (v) steam oxidation, (vi) printing and oxidizing a composition comprising of silicon particles, and (vii) growing and oxidizing a porous silicon layer.

4. A method of claim 1, wherein the thickness of the silicon dioxide layer is between 10 nm and 100 nm.

5. A method of claim 1, wherein a doped layer is formed on the front surface of the silicon substrate prior to the step (b) and wherein the doped layer is doped with the same dopant as the dopant of the silicon substrate.

6. A method of claim 1, further comprising steps of:
   (g) forming a passivation layer on both the front surface and the rear surface; and
   (h) forming a first electrode and a second electrode on the rear surface, wherein the first electrode is in electric contact with the p+ region on the rear surface of the silicon substrate and wherein the second electrode is in electric contact with the n+ region on the rear surface of the silicon substrate.

7. A method of claim 6, wherein the passivation layer comprises a first passivation layer and a second passivation layer formed on the first passivation layer, wherein the first passivation layer consists of silicon oxide or aluminum oxide and wherein the second passivation layer consists of silicon nitride.

8. A method of claim 6, wherein the first electrode and the second electrode are formed by screen printing and firing a paste containing silver powder.

9. A method of claim 6, wherein the step (h) comprises the steps of:
- (h1) forming the first electrode over the p+ region on the rear surface;
- (h2) forming the second electrode over the n+ region on the rear surface;
- (h3) forming a patterned insulator layer over part of the first electrode and part of the second electrode;
- (h4) forming a first busbar having electrical connection with the first electrode, wherein electrical shunt path between the first busbar and the second electrode is prevented by the insulator layer existing between the first busbar and the second electrode; and
- (h5) forming a second busbar having electrical connection with the second electrode, wherein electrical shunt path between the second busbar and the first electrode is prevented by the insulator layer existing between the second busbar and the first electrode.

10. A method of claim 9, wherein the patterned dielectric insulator layer is formed by screen printing a paste comprising a ceramic powder or oxide powder and an organic vehicle over the first and second electrodes.

11. A method of claim 1, wherein the first temperature is 850-1000° C., wherein the first ambient is nitrogen, oxygen, or mixture thereof, wherein the second temperature is 850-1000° C., and wherein the second ambient is nitrogen, oxygen, or a mixture thereof.

* * * * *